(12) United States Patent
Taniguchi et al.

(10) Patent No.: US 11,309,164 B2
(45) Date of Patent: Apr. 19, 2022

(54) HIGH-FREQUENCY POWER SUPPLY SYSTEM

(71) Applicant: DAIHEN Corporation, Osaka (JP)

(72) Inventors: Michio Taniguchi, Osaka (JP);
Kuniaki Miyoshi, Osaka (JP);
Katsushi Michishita, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/092,878

(22) Filed: Nov. 9, 2020

(65) Prior Publication Data

US 2021/0159051 A1    May 27, 2021

(30) Foreign Application Priority Data

Nov. 25, 2019  (JP) .............................. JP2019-212488

(51) Int. Cl.
*H01J 37/32* (2006.01)
(52) U.S. Cl.
CPC .............................. *H01J 37/32183* (2013.01)
(58) Field of Classification Search
CPC .................................................. H01J 37/32183
See application file for complete search history.

(56) References Cited

U.S. PATENT DOCUMENTS

| | | | |
|---|---|---|---|
| 7,251,121 B2 | 7/2007 | Bhutta | |
| 7,298,128 B2 | 11/2007 | Bhutta | |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |
| 9,745,660 B2 | 8/2017 | Bhutta | |
| 9,755,641 B1 | 9/2017 | Bhutta | |

(Continued)

FOREIGN PATENT DOCUMENTS

JP        H7-74159 A      3/1995

*Primary Examiner* — Henry Luong
(74) *Attorney, Agent, or Firm* — Bret E. Field; Bozicevic, Field & Francis LLP

(57) ABSTRACT

Techniques for suppressing an increase in reflected wave power (reflection coefficient) due to IMD are proposed. A high-frequency power supply system for providing a high-frequency power to a connected load includes: a bias power supply which outputs a bias power at a first frequency; a source power supply which outputs a source power at a second frequency higher than the first frequency; and a matching unit including an impedance matching circuit which acquires the bias power and the source power and matches an impedance of the source power supply side with an impedance of the load side. The source power supply determines a delay setting value indicating the timing of starting a frequency variation process with respect to the source power, performs the frequency variation process using the delay setting value and the value of the first frequency, and outputs a frequency-varied source power to the matching unit.

12 Claims, 17 Drawing Sheets

(56) References Cited

U.S. PATENT DOCUMENTS

| | | |
|---|---|---|
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 10,707,057 B2 | 7/2020 | Bhutta et al. |
| 10,727,029 B2 | 7/2020 | Ulrich et al. |
| 2016/0065207 A1 | 3/2016 | Bhutta |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |
| 2020/0035461 A1 | 1/2020 | Bhutta et al. |
| 2020/0051788 A1* | 2/2020 | Ulrich .................... H03H 7/38 |
| 2020/0066488 A1 | 2/2020 | Ulrich et al. |
| 2020/0066489 A1 | 2/2020 | Lozic et al. |
| 2020/0083022 A1 | 3/2020 | Huang et al. |

\* cited by examiner

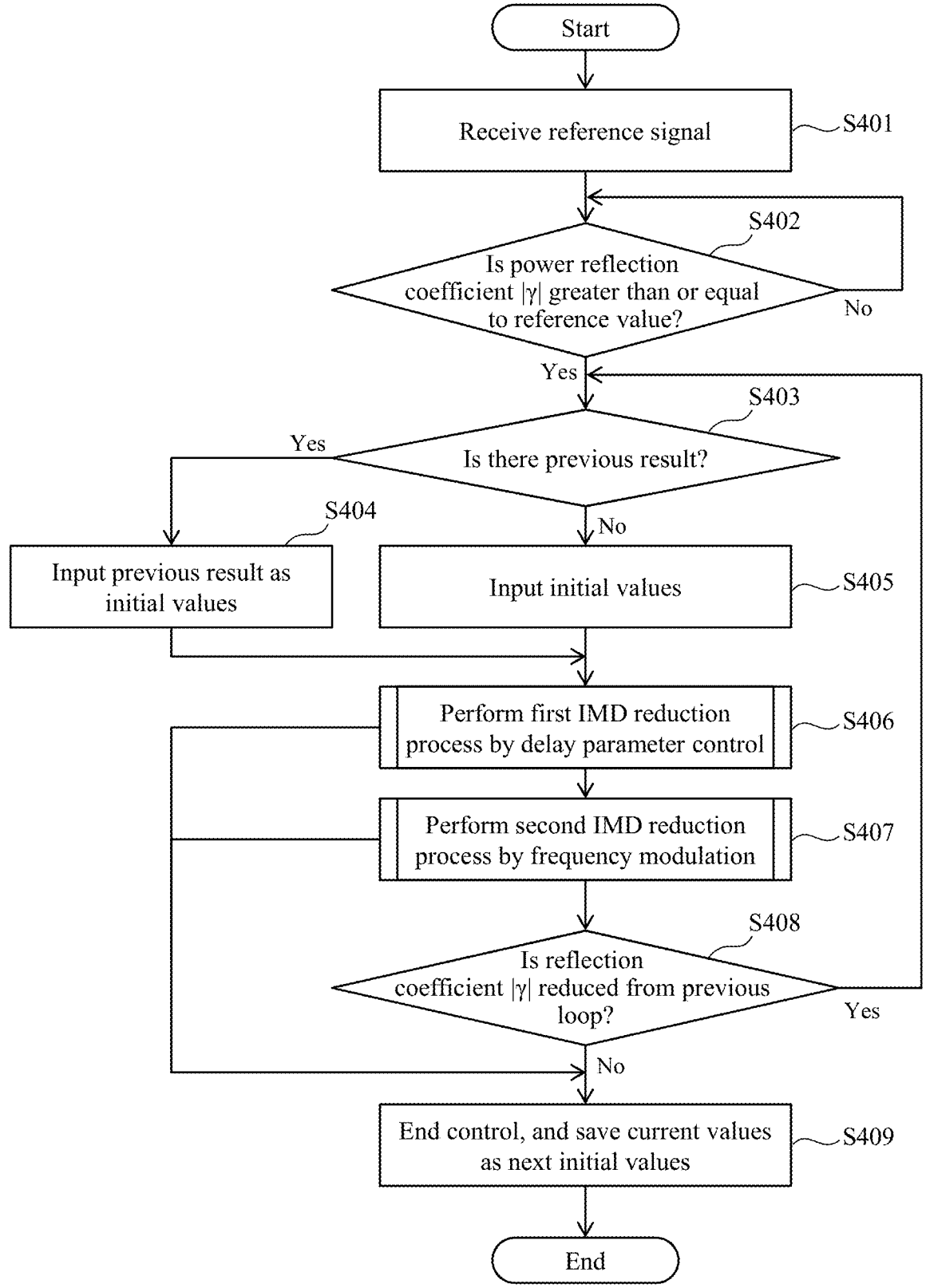

HIGH-FREQUENCY POWER SUPPLY SYSTEM

BACKGROUND

Technical Field

The present disclosure relates to a high-frequency power supply system.

Background Art

In the field of semiconductor manufacturing, high-density packaging is being required as electronic devices become smaller and more enhanced. Connections of elements to a mounting substrate have become miniaturized, and packaging needs to be performed with ever higher reliability.

As a method for ensuring packaging reliability, a surface modification method using a plasma may be employed. For example, by subjecting a substrate to be processed to plasma processing, it becomes possible to remove contamination due to organic matter attached to the surface of the substrate, and to improve wire bonding strength, wettability, and adhesion between the substrate and sealing resin. To perform such plasma processing, it is necessary to connect a power supply device to a plasma reactor device.

For example, JP H07-74159 A discloses a configuration example of power supply devices connected to a plasma reactor device. Specifically, JP H07-74159 A discloses a configuration in which a high-frequency (source) power supply and a low-frequency (bias) power supply are superimposed with each other via a matching circuit to supply the plasma reactor device. In the matching circuit, impedance matching is performed between the power supply side and the plasma reactance device side to achieve efficient supply of power.

SUMMARY

When a dual-frequency power supply is provided, as described in JP H07-74159 A, it is known that a plasma sheath is generated together with a plasma in a plasma chamber of the plasma reactor device. The plasma sheath may be generally considered to be electrically insulated, and it may be considered that a virtual capacitor is formed between electrodes of the plasma chamber. Because the position of the plasma varies in conjunction with a periodic change in the voltage of the low-frequency (bias) power supply, the capacitance of the plasma sheath also varies periodically (for example, at the same period as or twice the period of the bias frequency, depending on the plasma chamber structure). This means that the plasma impedance changes at high speed due to a change in the voltage of the bias power supply.

However, in the case of a matching unit in which an impedance-variable element is operated by a motor, the matching operation may not be able to follow the high-speed changes in plasma impedance. As a result, the amount of reflected wave power that is fed back to the output end of the source power supply may be increased by inter-modulation distortion (IMD). Because an increase in reflected waves prevents an efficient and accurate supply of power to the load side, the IMD needs to be reduced.

In view of the circumstances noted above, the present disclosure proposes techniques for suppressing an increase in reflected wave power (which is synonymous with reflection coefficient) due to IMD.

The present disclosure provides a high-frequency power supply system for providing high-frequency power to a connected load, the system including: a bias power supply which outputs a bias power at a first frequency; a source power supply which outputs a source power at a second frequency higher than the first frequency; and a matching unit including an impedance matching circuit which acquires the bias power and the source power and matches an impedance of the source power supply side with an impedance of the load side. The matching unit superimposes the source power with the bias power and supplies the load with a superimposed power. The source power supply acquires information about the first frequency, determines a delay setting value indicating a timing of starting a frequency variation process with respect to the source power, performs the frequency variation process using the delay setting value and a value of the first frequency, and outputs a frequency-varied source power to the matching unit.

Further features relating to the present disclosure will become apparent from the following descriptions and the attached drawings. Aspects of the present disclosure may be achieved or implemented by various elements and various combinations of such elements as disclosed in the following detailed descriptions and the claims that follow.

It should be understood that the descriptions that follow are for exemplary purposes only, and do not in any way represent a limitation of the scope of the claims or application examples.

According to the techniques of the present disclosure, it is possible to reduce IMD generated on the load side in a power supply device for providing a dual-frequency power supply, and to suppress an increase in reflected wave power (reflection coefficient) due to IMD.

BRIEF DESCRIPTION OF THE DRAWINGS

FIG. 3A illustrates variations in the value of a power reflection coefficient $|\gamma|$ prior to FM modulation, and FIG. 3B illustrates variations in the value of the power reflection coefficient after FM modulation;

FIG. 4 is a flowchart for describing the outline of an IMD reduction (power reflection coefficient $|\gamma|$ suppression) process according to a first embodiment;

FIG. 10A illustrates an internal configuration example of the HF_RF circuit 131 according to the first embodiment, and FIG. 10B illustrates an internal configuration example of the HF_RF circuit 131 according to the second embodiment;

FIG. 11A illustrates variations in the absolute value |γ| of the power reflection coefficient when, as in FIG. 3A, the output of the source power supply is output as is (without even FM modulation). FIG. 11B illustrates variations in the absolute value |γ| of the power reflection coefficient when, as in FIG. 3B, the output of the source power supply 110 is only FM modulated. FIG. 11C illustrates variations in the absolute value |γ| of the power reflection coefficient when the output of the source power supply 110 is FM modulated and is also subjected to phase change in the susceptance circuit;

DETAILED DESCRIPTION

In the following, embodiments of the present disclosure will be described with reference to the attached drawings. In the attached drawings, functionally identical elements may be designated with identical numerals. The attached drawings illustrate concrete embodiments and implementation examples in accordance with the principles of the present disclosure. However, these are provided to assist an understanding of the present disclosure and should not be construed as limiting the present disclosure.

While the embodiments are described in sufficient detail to enable a person skilled in the art to practice the present disclosure, it will be understood that other implementations or embodiments are also possible, and that various changes to configurations or structures and various substitutions of elements may be made without departing from the scope and spirit of the technical concepts of the present disclosure. Accordingly, the following descriptions are not to be interpreted in a limiting sense.

Furthermore, embodiments of the present disclosure may be implemented using software running on a general-purpose computer, or may be implemented using dedicated hardware or in a combination of software and hardware.

(1) First Embodiment

<Configuration Examples of Power Supply System 100>

(i) Configuration Example 1

Figure 1:
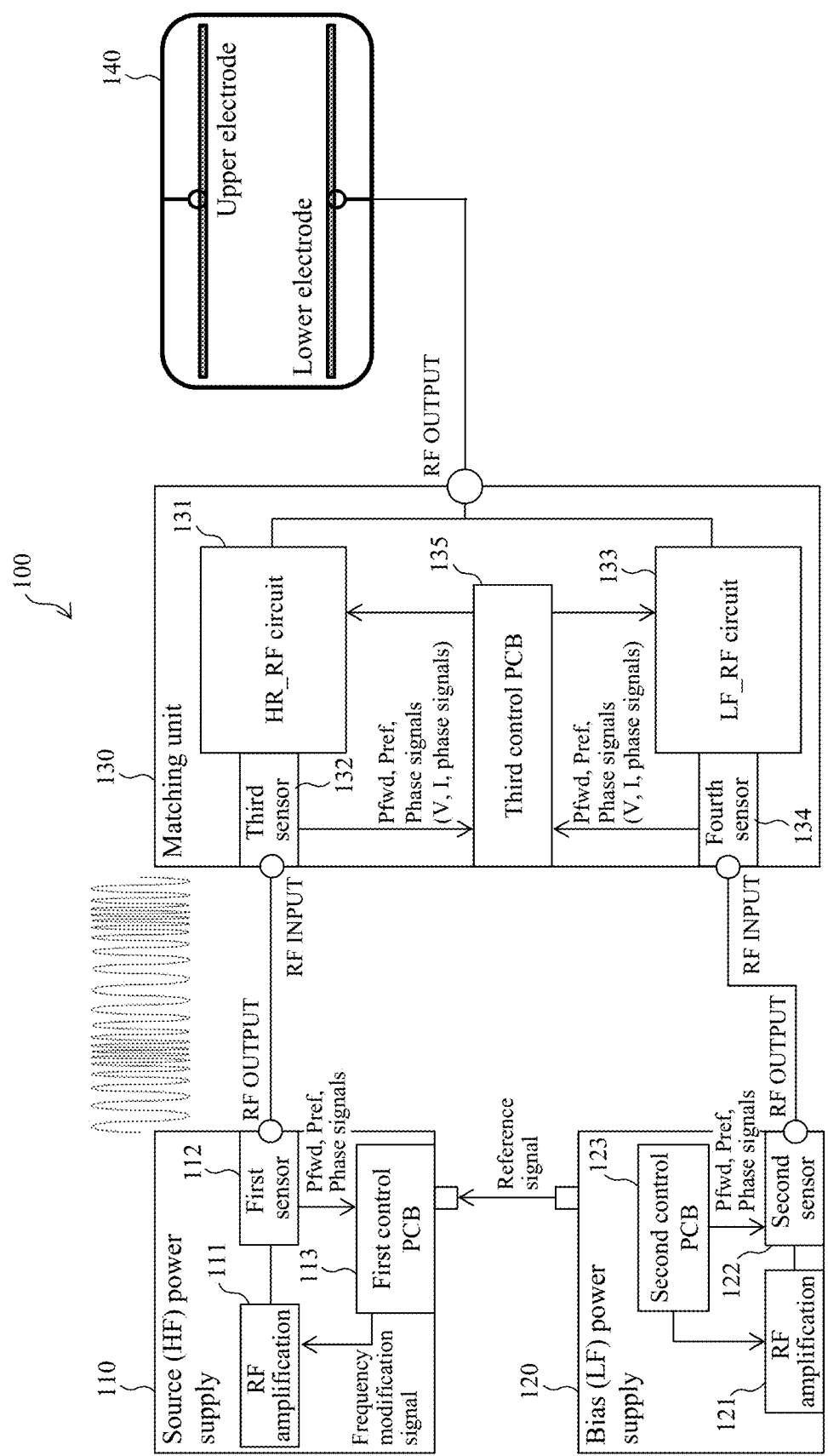
FIG. 1 illustrates a power supply system (which may be also referred to as a high-frequency power supply system) 100 according to Configuration Example 1 of an embodiment, to which a plasma load 140 is connected.

FIG. 1 illustrates a power supply system (which may also be referred to as a high-frequency power supply system) 100 according to Configuration Example 1 of the present embodiment, to which a plasma load 140 is connected. The power supply system 100 is provided with: a source (high-frequency) power supply 110; a bias (low-frequency) power supply 120; and a matching unit 130 to which respective outputs from the source (high-frequency) power supply 110 and the bias (low-frequency) power supply 120 are supplied, and which achieves impedance matching between the side of the power supply devices 110 and 120 and the plasma load 140 side. The system superimposes the power from the source power supply 110 (source power) and the power from the bias power supply 120 (bias power) upon each other, for example, and supplies the superimposed power to the plasma load 140.

The source power supply 110 includes an RF amplifier 111, a first sensor 112, and a first control device 113. The RF amplifier 111, in response to a control signal from the first control device 113, amplifies a high-frequency signal of a predetermined frequency (for example, 40.68 MHz, 60 MHz, 100 MHz, or 120 MHz) and supplies the amplified signal to the first sensor 112. The first sensor 112 detects the high-frequency output (forward wave power (traveling wave power)) from the RF amplifier 111, and also detects a reflected wave power and a phase signal from the matching unit 130. Further, the first sensor 112 outputs the forward wave power to the matching unit 130 and also outputs the detected forward wave power value, reflected wave power, and phase signal to the first control device 113.

The first control device 113 includes a processor, a memory, and an I/O interface, for example. The first control device 113 acquires a forward wave power value, a reflected wave power value, and a phase signal from the first sensor 112, and acquires a reference signal (a synchronization signal: a signal defined by the frequency of the bias power supply and indicating a frequency value of the bias power supply provided to the matching unit) from the bias power supply 120. The first control device 113, using the forward wave power value and the reflected wave power value acquired from the first sensor 112, calculates a power reflection coefficient $\gamma(\gamma=(Pr/Pf)^{0.5}$, where Pr is the forward wave power value, and Pf is the reflected wave power value). The first control device 113 then monitors whether the absolute value |γ| of the power reflection coefficient γ is equal to or greater than a predetermined reference value, and determines whether to cause the RF amplifier 111 to perform frequency modulation. The power reflection coefficient γ becomes zero in a non-reflected wave state and one in a total reflection state. When the influence of the inter-modulation distortion (IMD) is greater, the power reflection coefficient |γ| becomes greater. Accordingly, if the value of the power reflection coefficient γ, i.e., the magnitude of the reflected wave power, can be reduced, the influence of variations in plasma sheath capacitance (IMD) can be reduced. The plasma sheath capacitance varies in accordance with the bias frequency. For example, depending on the structure of the plasma chamber, the plasma sheath capacitance may vibrate at twice the bias frequency or at the bias frequency. Thus, the power reflection coefficient γ also varies at the bias frequency.

In order to reduce the influence of IMD, FM modulation is considered effective. When it is determined that frequency modulation should be performed, the first control device 113, in accordance with the reference signal (bias frequency indicating the variation of the bias voltage) acquired from the bias power supply 120, generates an FM modulation signal indicating a degree of FM modulation and a modification to a time tdelay, and transmits the FM modulation signal to the RF amplifier 111. The RF amplifier 111, in accordance with the FM modulation signal supplied from the first control device 113, FM modulates the amplified high-frequency signal. The FM modulation is performed in accordance with the following expression (1) or expression (2). Whether expression (1) or (2) is effective for reducing the power reflection coefficient γ upon occurrence of IMD depends on the structure of the upper electrode and lower electrode of the plasma chamber. As will be described below, the first control device 113 initially attempts IMD reduction by performing FM modulation by varying a delay setting tdelay, and, if this does not result in a sufficient decrease in IMD, then attempts IMD reduction by performing FM modulation by varying frequency in increments of a predetermined width Δf.

$$Fm = FHF + \Delta f \times \sin(2\pi FLF \times (t + tdelay)) \quad (1)$$

$$Fm = FHF + \Delta f \times \sin(4\pi FLF \times (t + tdelay)) \quad (2)$$

Fm: Frequency of source power supply that is output upon occurrence of IMD;
ERR Fundamental frequency of source power supply;
ELF: Fundamental frequency of bias power supply;
Δf: Frequency variation width (parameter);
tdelay: Delay setting (parameter) for starting frequency variation Further, in consideration of harmonics generated in a plasma, the expressions may be modified to the following expression (3) to handle changes in plasma sheath capacitance (impedance change) due to harmonics of the bias power supply 120:

$$Fm = FHF + \Delta f1 \times \sin(2\pi FLF \times (t + tdelay1)) +$$

$$\Delta f2 \times \sin(4\pi FLF \times (t + tdelay2)) +$$

$$\Delta f3 \times \sin(6\pi FLF \times (t + tdelay3)) \quad (3)$$

Fm: Frequency of source power supply that is output upon occurrence of IMD;
FHF: Fundamental frequency of source power supply;
FLF: Fundamental frequency of bias power supply;
Δf1 to f3: Frequency variation width (parameter);
tdelay1 to 3: Delay setting (parameter) for starting frequency variation The bias power supply 120 includes an RF amplifier 121, a second sensor 122, and a second control device 123. The RF amplifier 121, in response to a control signal from the second control device 123, amplifies a low-frequency signal of a predetermined frequency (for example, 400 kHz, 800 kHz, 1.2 MHz, 2 MHz, or 3.2 MHz), and supplies the amplified low-frequency signal to the second sensor 122. The second sensor 122 detects a low-frequency output (forward wave power) from the RF amplifier 121 and also detects a reflected wave power and a phase signal from the matching unit 130. Further, the second sensor 122 outputs the forward wave power to the matching unit 130 and outputs the detected forward wave power value, reflected wave power, and phase signal to the second control device 123.

The phase signal constitutes a phase difference between the forward wave power and the reflected wave power. Specifically, as the first sensor 112 and the second sensor 122, directional couplers are used, for example. The first sensor 112 and the second sensor 122 each detect a voltage signal including information about the forward wave power and a voltage signal including information about the reflected wave power. Thus, it is possible to acquire information about the forward wave power and reflected wave power based on the voltage signals. Meanwhile, as a third sensor 132 and a fourth sensor 134 provided in the matching unit 130, VI sensors may be adopted, for example, and these may be used to detect three signals of a voltage V, a current I, and a phase difference between V and I. From the three signals, it is possible to determine a power reflection coefficient, a forward wave power, and a reflected wave power.

The VI sensors provided in the matching unit 130 may be replaced by the first sensor 112 and the second sensor 122 used on the power supply side. In this case, it is possible to determine the power reflection coefficient, the forward wave power, and the reflected wave power from the voltage signal including information about the forward wave power and the voltage signal including information about the reflected wave power.

When a VI sensor type is adopted for the first sensor 112 and the second sensor 122, the power reflection coefficient, the forward wave power, and the reflected wave power may be determined from the voltage V, the current I, and the phase difference between V and I. When forward wave power/reflected wave power sensors (so-called directional couplers) are adopted as the first sensor 112 and the second sensor 122 sensor, a power reflection coefficient, a forward wave power, and a reflected wave power may be determined from a forward wave power, a reflected wave power, and a phase difference between the forward wave power and the reflected wave power.

The second control device 123, similarly to the first control device 113, includes a processor, a memory, and an I/O interface, for example, and acquires from the second sensor 122 a forward wave power value, a reflected wave power value, and a phase signal. The second control device 123 also provides the reference signal to the first control device 113 of the source power supply 110.

The matching unit 130 is provided with an HF_RF circuit 131, a third sensor 132, an LF_RF circuit 133, a fourth sensor 134, and a third control device 135. The HF_RF circuit 131 is composed of, for example, a variable-impedance element (variable capacitor) and an inductor (coil), and performs an operation to automatically achieve impedance matching between the source power supply 110 side and the load 140 side. The third sensor 132 detects, from the forward wave power supplied from the source power supply 110 and the load 140, the reflected wave power to the source power supply 110 side, senses phase signals (V and I phase signals), and provides these to the third control device 135. The LF_RF circuit 133, similarly to the HF_RF circuit 131, is composed of a variable-impedance element (variable capacitor) and an inductor (coil), for example, and performs an operation (by changing the capacitance of the variable capacitor) to automatically achieve impedance matching between the bias power supply 120 side and the load 140 side. The fourth sensor 134 detects the forward wave power supplied from the bias power supply 120 and the reflected wave power from the load 140 to the bias power supply 120 side, senses phase signals (V and I phase signals), and provides these to the third control device 135. The third control device 135, on the basis of the information (forward wave power value, reflected wave power value, and phase signal) from the third sensor 132 and the fourth sensor 134, determines control values for variable capacitors in the HF_RF circuit 131 and the LF_RF circuit 133, and notifies the circuits. The HF_RF circuit 131 and the LF_RF circuit 133, using the control values from the third control device 135, each adjust the capacitance of the variable capacitor and achieve impedance matching. However, when IMD is being generated by variations in plasma sheath capacitance, the operation by the HF_RF circuit 131 and the LF_RF circuit 133 may not be sufficient to achieve impedance matching, and a relatively large reflected wave power may be returned to the source power supply 110 side. Thus, according to the present embodiment, the source power supply is subjected to FM modulation to reduce the power reflection coefficient γ (in other words, the reflected wave power, or IMD).

(ii) Configuration Example 2

Figure 2:
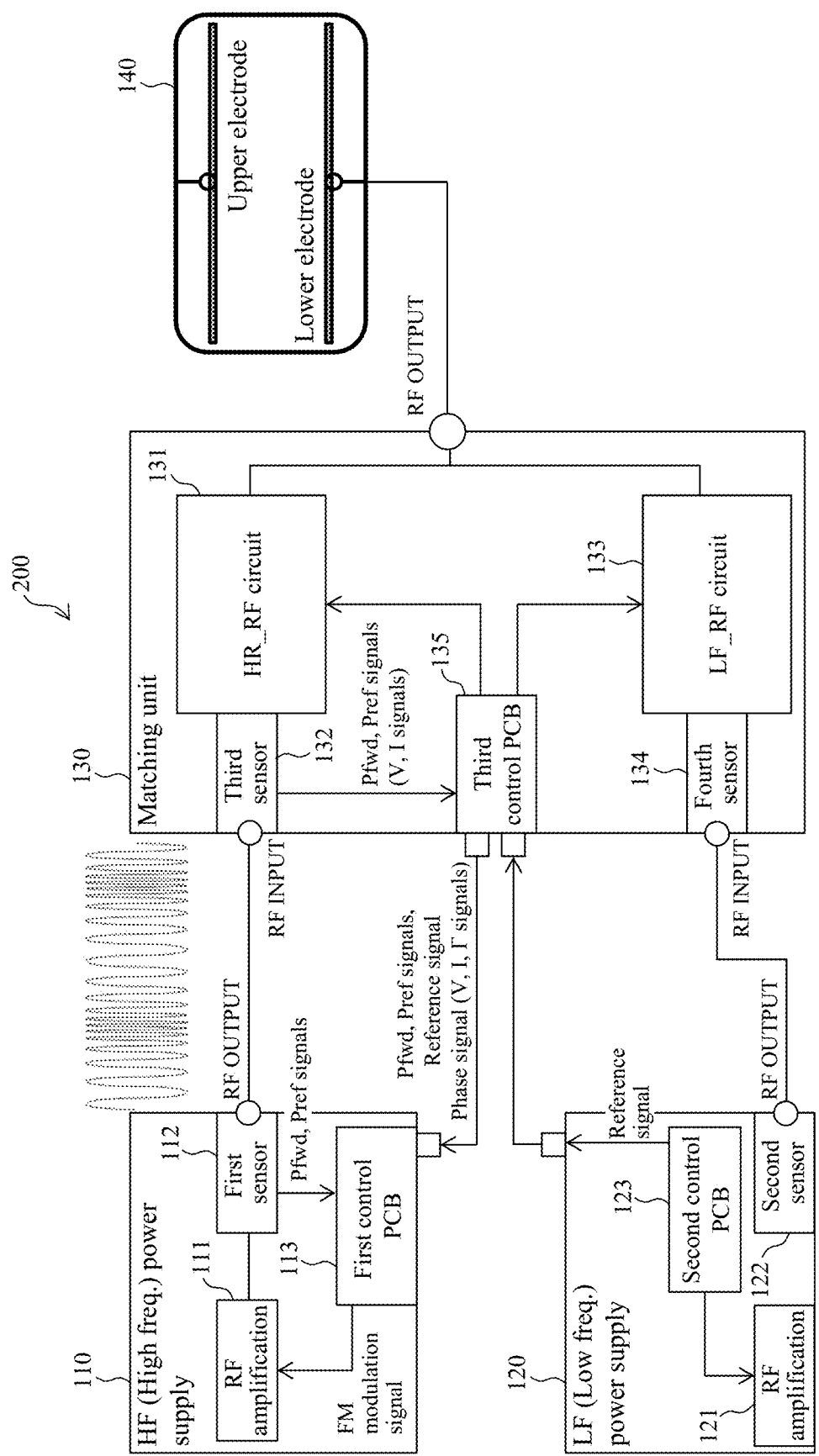
FIG. 2 illustrates a power supply system 200 according to Configuration Example 2 of the embodiment, to which the plasma load 140 is connected.

FIG. 2 illustrates a power supply system 200 according to Configuration Example 2 of the present embodiment to which the plasma load 140 is connected. The power supply system 200 has a configuration similar to that of the power supply system 100 according to Configuration Example 1. The power supply system 200, however, differs from Configuration Example 1 in that the reference signal is acquired not from the bias power supply 120 but via the third control device 135 of the matching unit 130.

In Configuration Example 2 illustrated in FIG. 2, the bias power supply 120 transmits the reference signal to the third control device 135 of the matching unit 130. The third control device 135, in addition to the forward wave power value, the reflected wave power value, and the phase signals detected by the third sensor 132, transmits the reference signal acquired from the bias power supply 120 to the first control device 113 of the source power supply 110. The first control device 113 of the source power supply 110, as described with reference to Configuration Example 1, controls the RF amplifier 111 to perform FM modulation in accordance with the value of the power reflection coefficient γ. The operation is similar to that of Configuration Example 1 and therefore a detailed description thereof will be omitted. Further details of the FM modulation process in the source power supply will be described later.

<Effects of FM Modulation>

Figure 3A:
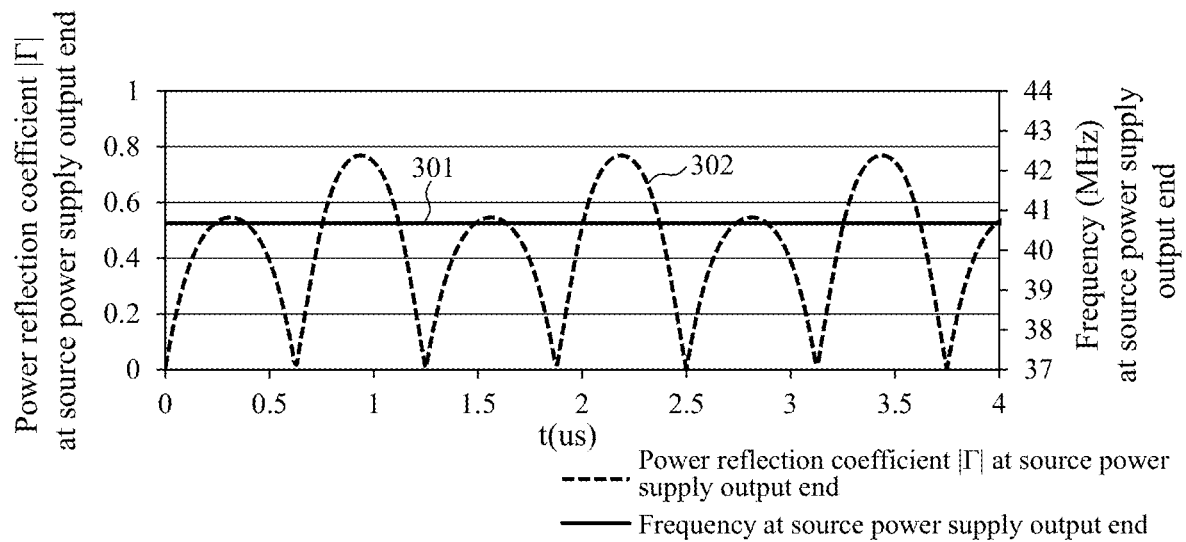
FIGS. 3A-3B illustrate technical effects obtained when a source power supply output is FM-modulated in accordance with a bias frequency (the frequency of voltage variation supplied by a bias power supply).
Figure 3B:
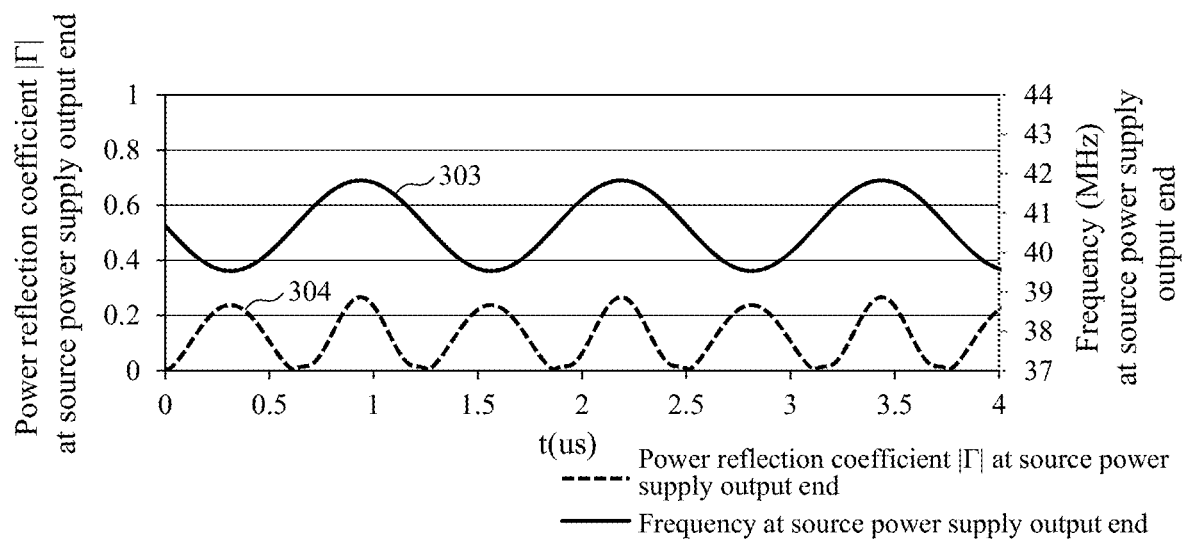

FIGS. 3A-3B illustrate the technical effects obtained when the source power supply output is FM modulated in accordance with the bias frequency (the frequency of voltage variations supplied by the bias power supply). FIG. 3A illustrates variations in the value of the power reflection coefficient |γ| prior to FM modulation. FIG. 3B illustrates variations in the value of the power reflection coefficient |γ| after FM modulation.

As illustrated in FIG. 3A, when the output (power) supply of the source power supply 110 is provided at a certain frequency (for example, 40.68 MHz, 60 MHz, 100 MHz, or 120 MHz) (see waveform 301), the absolute value |γ| (corresponding to the variation in the value of the reflected wave power) 302 of the power reflection coefficient at the output end of the source power supply 110 may become very large, indicating that the power supply is not efficient. That is, of the power fed from the source power supply 110 side to the load 140 side, approximately 60% is returned as reflected wave power (because reflected wave power=forward wave power×|γ|^2; see the values of the power reflection coefficient |γ| in FIG. 3A).

On the other hand, as illustrated in FIG. 3B, when the frequency of the source power supply 110 is modulated when high-frequency power is provided to the load 140 side (see waveform 303), it is possible to reduce the absolute value |γ| 304, at the output end of the source power supply 110, of the power reflection coefficient generated by IMD. Thus, it will be understood that the effect of reducing IMD can be expected by modifying (FM modulating) the frequency of the source power supply 110.

<Contents of IMD Reduction (Power Reflection Coefficient |γ| Suppression) Process>

Figure 5:
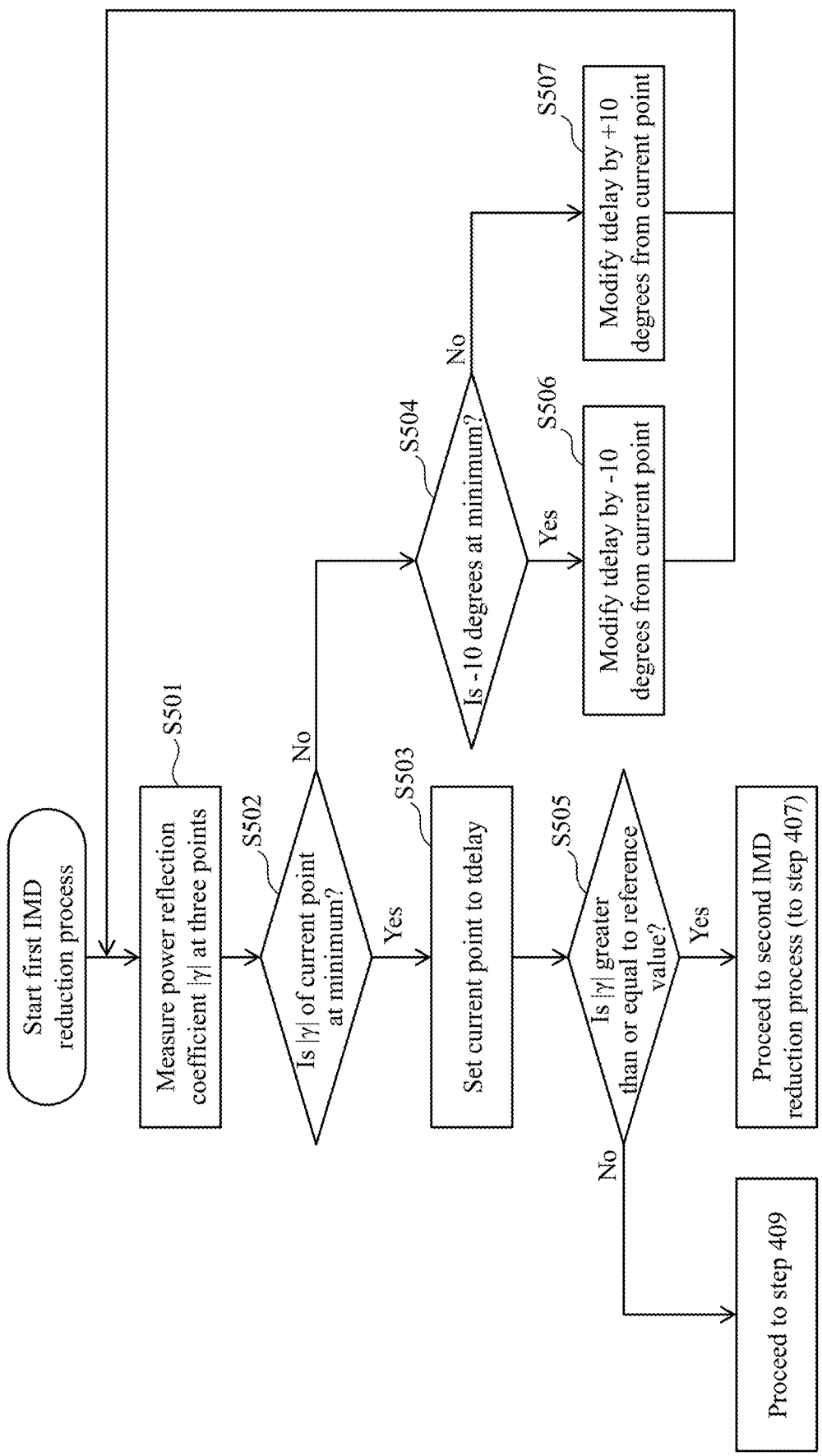
FIG. 5 is a flowchart for describing the details of step 406 (first IMD reduction process by delay parameter control) of FIG. 4.
Figure 7:
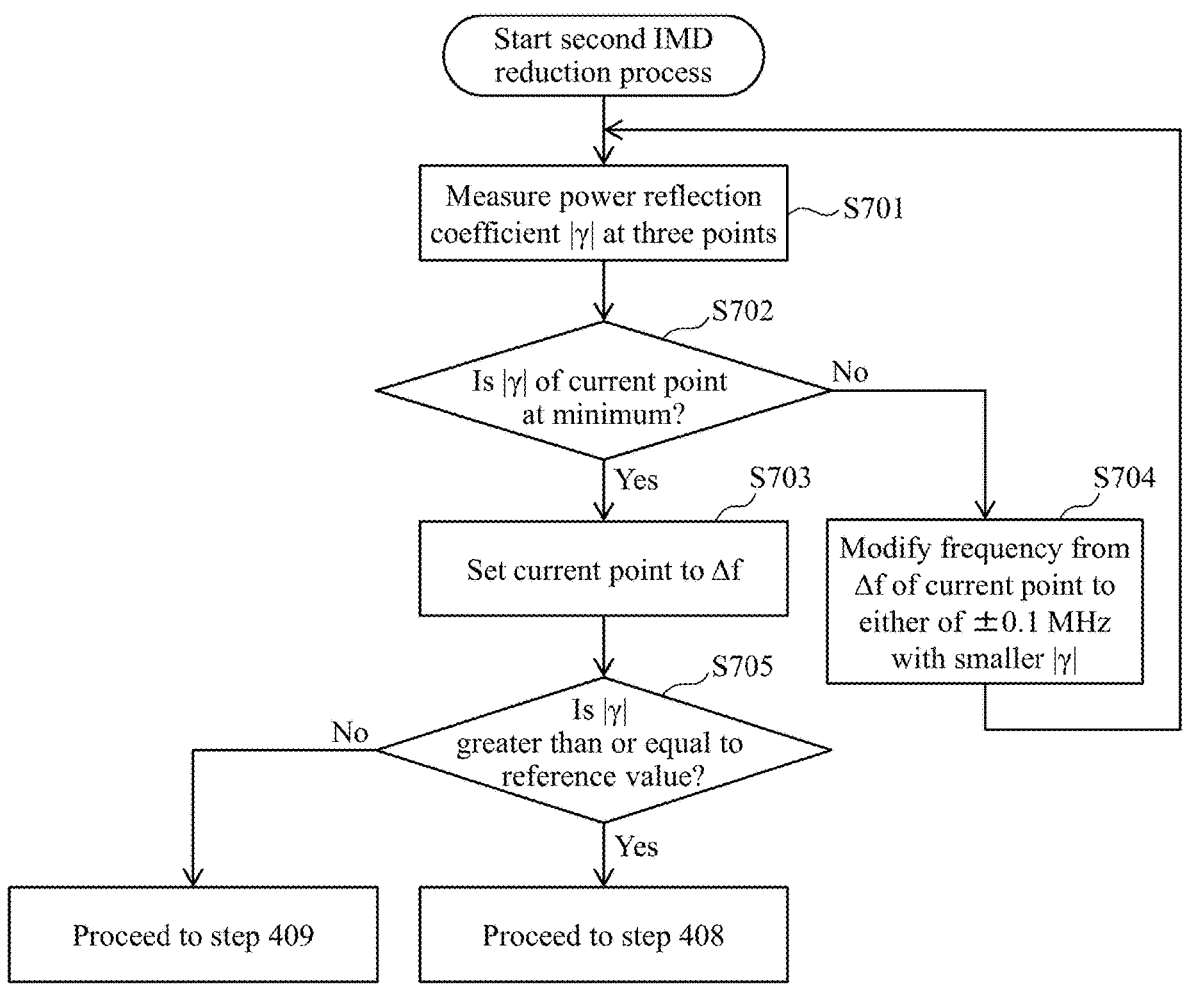
FIG. 7 is a flowchart for describing the details of a second IMD reduction process (step 407 in FIG. 4) by frequency modulation.

FIG. 4 is a flowchart for describing the outline of the IMD reduction (power reflection coefficient |γ| suppression) process according to the first embodiment. FIG. 5 is a flowchart for describing the details of step 406 (a first IMD reduction process by delay parameter control) of FIG. 4. Further, FIG. 7 is a flowchart for describing the details of step 407 (a second IMD reduction process by frequency modulation) of FIG. 4. The IMD reduction process is performed by the first control device 113 of the source power supply 110. Accordingly, the process will be described assuming that the operation of each of the steps of FIG. 4, FIG. 5, and FIG. 7 is performed by the first control device 113 (which may be regarded as a processor).

A. Overview of IMD Reduction (Power Reflection Coefficient |γ| Suppression) Process (FIG. 4)

(i) Step 401

The first control device 113 receives, from the bias power supply 120 or the matching unit 130, information about the operation frequency of the bias power supply 120 (the information about the operation frequency of the bias power supply may be acquired in the form of a reference signal or a synchronization signal). The first control device 113 also acquires, from the first sensor 112 or the third control device 135 of the matching unit 130, a forward wave power value, a reflected wave power value, and phase signals, and calculates the absolute value |γ| of the power reflection coefficient (γ=(Pr/Pf)^0.5, as described above).

(ii) Step 402

The first control device 113 determines whether the power reflection coefficient |γ| calculated in step 401 is equal to or greater than a predetermined reference value set in advance. If the |γ| is less than the reference value (No in step 402), it is determined that the need for reducing IMD is low, and monitoring of the |γ| relative to the reference value is continued. If the |γ| is greater than or equal to the reference value (Yes in step 402), the process proceeds to step 403.

(iii) Step 403

The first control device 113 determines whether previous results (parameter values; in the first embodiment, the delay setting tdelay for starting frequency variation, and the frequency variation width ΔF) are stored in, for example, an internal memory (not shown). If previous results are stored in memory (Yes in step 403), the process proceeds to step 404. If previous results are not stored in memory (No in step 403), the process proceeds to step 405.

(iv) Step 404

The first control device 113 reads the previous parameter values stored in an internal memory, for example.

(v) Step 405

The first control device 113 either acquires initial values that are set in advance and stored in memory, or acquires initial values that are set by the user. The initial values may include, for example, a delay setting tdelay of 90 degrees and a frequency variation width Δf of 0.1 MHz (or modulation ratio of 10%). For example, these initial values may comprise provisional values that may be modified by the user in operation.

(vi) Step 406

The first control device 113 performs the first IMD reduction process by delay parameter control. If the |γ| became less than a predetermined reference value on account of the first IMD reduction process, the process proceeds to step 409. On the other hand, if the |γ| remained greater than or equal to the predetermined reference value, the process proceeds to step 407. The details of the first IMD reduction process by delay parameter control will be described later with reference to FIG. 5 and FIG. 6.

(vii) Step 407

The first control device 113 performs the second IMD reduction process by frequency modulation. If the |γ| became less than the predetermined reference value on account of the second IMD reduction process, the process proceeds to step 409. On the other hand, if the |γ| remained greater than or equal to the predetermined reference value, the process proceeds to step 408. The details of the second IMD reduction process by frequency modulation will be described later with reference to FIG. 7 and FIG. 8.

(viii) Step 408

The first control device 113 determines whether the current value |γ| of the power reflection coefficient has decreased from the result (the value |γ| of the power reflection coefficient) obtained by the previous loop (previous IMD reduction process). If the current value |γ| of the power reflection coefficient is not decreased from the previous result (No in step 408), the process proceeds to step 409. If the current value |γ| of the power reflection coefficient is decreased from the previous result (Yes in step 408), the process proceeds to step 403. When the process returned to step 403, the "previous result" in step 403 corresponds to the parameter values on which the value |γ| of the power reflection coefficient obtained in step 407 that is greater than or equal to the reference value is based.

(ix) Step 409

The first control device 113 ends the IMD reduction process, and causes parameter values corresponding to the value |γ| of the power reflection coefficient obtained by the current process to be stored in memory as the initial values for the next process.

B. Details of First IMD Reduction Process by Delay Parameter Control

FIG. 5 is a flowchart for describing the details of the first IA) reduction process by delay parameter control (step 406).

(i) Step 501

The first control device 113, with respect to the three points of tdelay including a current point and points shifted therefrom by ±a predetermined angle (predetermined time), acquires the forward wave power and the reflected wave power, and calculates the absolute value |γ| of the power reflection coefficient. The ±predetermined angle may be adjustable by the user, and may be ±10 degrees (which correspond to ±0.035 μs when the bias frequency is 800 kHz), for example, in a case in which one period corresponds to 360 degrees.

Figure 6:
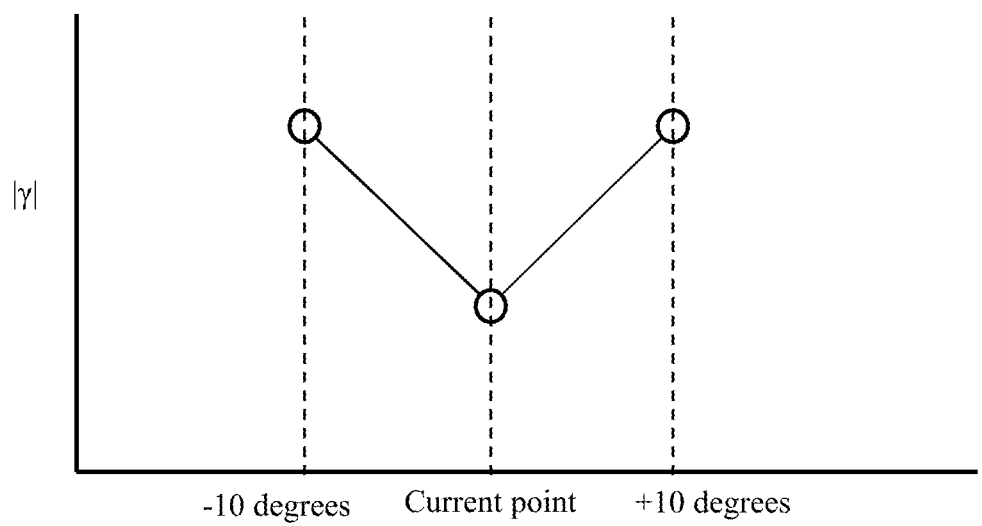
FIG. 6 illustrates the relationship (example) of the absolute values $|\gamma|$ of the power reflection coefficient, between tdelay of the current point and tdelay of points shifted from the current point by ±10 degrees.

FIG. 6 illustrates the relationship (example) of the absolute value |γ| of the power reflection coefficient between the current point of tdelay and the points of tdelay shifted from the current point by ±10 degrees. FIG. 6 illustrates an example in which the absolute value |γ| of the power reflection coefficient at the current point is at a minimum.

While herein the absolute value |γ| of the power reflection coefficient is being compared, the reflected wave power values per se may be compared. The calculation and comparison of the power reflection coefficient may be performed not by the first control device 113 of the source power supply 110, but by the third control device 135 of the matching unit 130. In this case, the first control device 113 of the source power supply 110 will acquire the comparison result from the matching unit 130.

ii) Step 502

The first control device 113 determines whether the absolute value |γ| of the power reflection coefficient at the current point, is at a minimum among the three points. If the absolute value |γ| of the power reflection coefficient at the current point is at a minimum (Yes in step 502), the process proceeds to step 503. If the absolute value |γ| of the power reflection coefficient at the current point is not at a minimum (No in step 502), the process proceeds to step 504.

(iii) Step 503

The first control device 1130 sets the delay angle (delay time) of the current point as tdelay, and acquires the absolute value |γ| of the power reflection coefficient.

(iv) Step 504

The first control device 113 determines whether the absolute value |γ| of the power reflection coefficient at the point of tdelay shifted from the current point by −10 degrees is at a minimum among the three points. If the absolute value |γ| of the power reflection coefficient at the point of tdelay shifted from the current point by −10 degrees is at a minimum (Yes in step 504), the process proceeds to step 506. If the absolute value |γ| of the power reflection coefficient at the point of tdelay shifted from the current point by +10 degrees is at a minimum among the three points (No in step 504), the process proceeds to step 507.

(v) Step 505

The first control device 113 determines whether the absolute value |γ| of the power reflection coefficient acquired in step 503 is greater than or equal to a preset reference value. If the |γ| is greater than or equal to the reference value (Yes in step 505), it cannot be said that the IMD has been sufficiently reduced by the first IMD reduction process. Accordingly, the process proceeds to the second IMD reduction process (step 407). If the |γ| is less than the reference value (No in step 505), the process proceeds to step 409.

(vi) Step 506

The first control device 113 sets the point of tdelay shifted from the current point by −10 degrees as the current point for the next loop. In this way, the point at which the absolute value |γ| of the power reflection coefficient is at a minimum is identified by changing the current point.

(vii) Step 507

The first control device 113 sets the point of tdelay shifted from the current point by 10 degrees as the current point for the next loop. In this way, the point at which the absolute value |γ| of the power reflection coefficient is at a minimum is identified by changing the current point.

C. Details of Second IMD Reduction Process by Frequency Modulation

FIG. 7 is a flowchart for describing the details of the second IMD reduction process by frequency modulation (step 407).

(i) Step 701

The first control device 113, with respect to each of the three cases of the frequency variation width Δf of the current point and the Δf±predetermined frequency, acquires the forward wave power and the reflected wave power, and calculates the absolute value |γ| of the power reflection coefficient. The ±predetermined frequency may be adjustable by the user, and may be ±0.1 MHz, for example.

Figure 8:
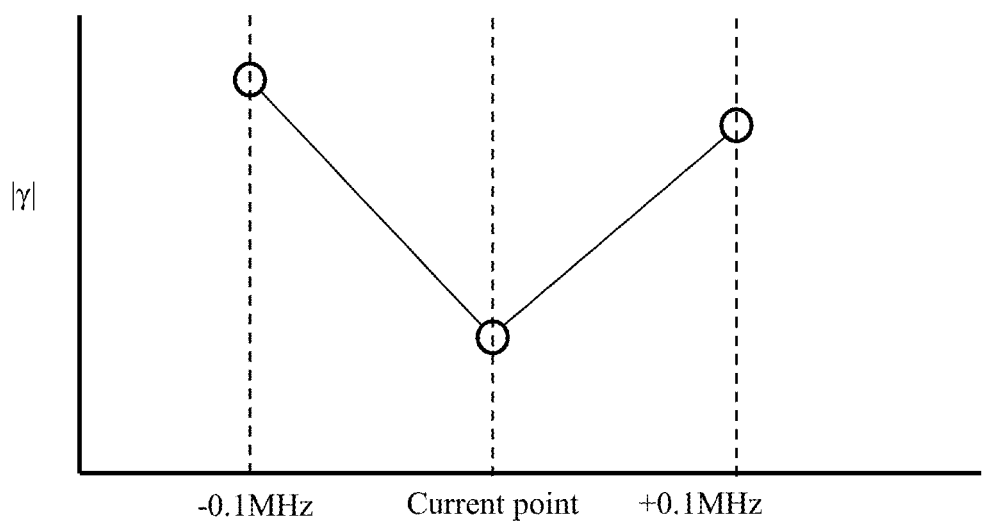
FIG. 8 illustrates the relationship (example) between the absolute value $|\gamma|$ of the power reflection coefficient when modulated with a frequency variation width Δf of the current point and the absolute value |γ| of the power reflection coefficient when modulated with Δf±0.1 MHz.

FIG. 8 illustrates the relationship (example) between the absolute value |γ| of the power reflection coefficient when modulated with the frequency variation width Δf of the current point and the absolute value |γ| of the power reflection coefficient when modulated with Δf±0.1 MHz. FIG. 8 illustrates an example in which the |γ| is smaller when modulated with the frequency variation width Δf of the current point than when modulated with Δf±0.1 MHz. However, the frequency variation width Δf−0.1 MHz never becomes smaller than 0.0 MHz. Accordingly, when Δf−0.1 MHz becomes 0.0 MHz computationally, comparison is performed only between the two points of the current point and the current point +0.1 MHz, and if the current point is at a minimum, the frequency variation width Δf of the current point is adopted; if the absolute value |γ| of the power reflection coefficient in the case of Δf+0.1 MHz becomes smaller than the absolute value |γ| of the power reflection coefficient of the current point, Δf+0.1 MHz is adopted.

(ii) Step 702

The first control device 113, in the case of the three points, determines whether the absolute value |γ| of the power reflection coefficient when modulated with the frequency variation width Δf of the current point is at a minimum among the three points. If the |γ| due to the frequency variation width Δf of the current point is at a minimum (Yes in step 702), the process proceeds to step 703. If the |γ| in the case of modulation with Δf±0.1 MHz, is smaller than the |γ| due to the variation width Δf of the current point (No in step 702), the process proceeds to step 704.

(iii) Step 703

The first control device 113 sets the frequency variation width of the current point as the frequency variation width Δf that is used for FM modulation.

(iv) Step 704

The first control device 113 sets the frequency with the smaller absolute value |γ| of the power reflection coefficient between Δf±0.1 MHz of the current point as the frequency variation width of the current point for the next loop.

(v) Step 705

The first control device 113 calculates the absolute value |γ| of the power reflection coefficient in the case of FM modulation with the Δf determined in step 703, and determines whether the |γ| is greater than or equal to a preset reference value (for which the reference value used in the determination of step 505 may be used). If the |γ| is greater than or equal to the reference value (Yes in step 705), the process proceeds to step 408. If the |γ| is less than the reference value (No in step 705), the process proceeds to step 409.

<Technical Effects Provided by First Embodiment>

According to the first embodiment, when the absolute value |γ| of the power reflection coefficient has become a predetermined value or greater, initially FM modulation having a low frequency variation width is fixed, and, while varying the delay setting (delay parameter: tdelay) that determines the timing of starting FM modulation, the source power supply output is controlled such that the |γ| becomes less than the predetermined value. Further, if sufficient IMD reduction (|γ|< the predetermined value) cannot be obtained only by the delay setting, the frequency of FM modulation is varied. In this way, it becomes possible to reduce IMD (the absolute value |γ| of the power reflection coefficient, or the magnitude of the reflected wave power), making it possible to provide the load with an efficient power supply.

(2) Second Embodiment

In the second embodiment, in addition to FM modulation, a phase modification circuit is provided in the matching unit 130 to limit the absolute value |γ| of the power reflection coefficient more than in the first embodiment (to achieve further IMD reduction).

Figure 9:
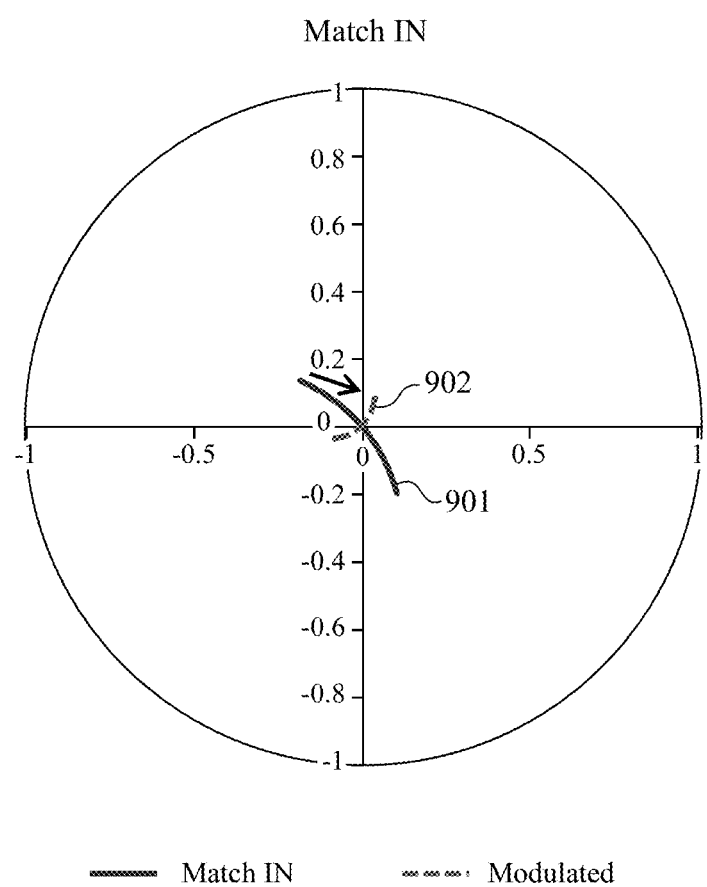
FIG. 9 is a Smith chart illustrating a change 901 in impedance locus due to IMD and a change 902 (first embodiment) in impedance locus due to FM modulation.

FIG. 9 illustrates a Smith chart indicating a change 901 in impedance locus due to IMD and a change 902 in impedance locus due to FM modulation (the first embodiment). In the Smith chart, zero (the origin) indicates a no-reflection state (a state in which none of the provided power is returned; power reflection coefficient |γ|=0), and 1 or −1 indicates a total reflection state (a state in which all of the provided power is returned; power reflection coefficient |γ|=1). The change 901 in impedance locus due to IMD without FM modulation is greater than the impedance locus 902 with FM modulation. Thus, it is seen that a certain IMD suppressing effect can be obtained. However, as will also be seen from FIG. 9, there are points at which the impedance changes do not overlap between the change 901 in impedance locus due to IMD and the change 902 in impedance locus due to FM modulation (the direction of change in impedance locus is also changed by a change in phase due to FM modulation). That is, the change in impedance locus due to FM modulation is various (because the change in plasma impedance locus is also dependent on gas, pressure, and other conditions), and does not necessarily always appear like the change 902 in impedance locus illustrated in FIG. 9. Even when the frequency is varied h FM modulation in order to reduce IMD, the power reflection coefficient may not stay within the predetermined range. Thus, FM modulation alone may not be effective. If the effect of IMD reduction is to be maximized, it is important to make the change 901 in impedance locus due to MD and the change 902 in impedance locus due to FM modulation overlap each other as much as possible. In other words, when the change 902 in impedance locus due to FM modulation and the change 901 in impedance locus due to IMD completely overlap each other, there is no reflection. However, when there is a distance between them, the magnitude of the vector (arrow) shown in FIG. 9 corresponds to the magnitude of the reflected wave. Accordingly, when the behavior of the impedance locus due to FM modulation and the behavior of the impedance locus due to IMD are looked at separately, if the behaviors are identical, IMD would have been completely erased; however, because the respective behaviors are based on separate principles, the influence of IMD cannot be cancelled completely unless they are matched and aligned.

Accordingly, in the second embodiment, in addition to FM modulation, the matching unit 130 is provided with a circuit for modifying phase to match a change in impedance locus due to FM modulation with a change in impedance due to IMD.

<Configuration Example of Power Supply System>

The configuration of either the power supply system 100 or 200 described with reference to the first embodiment may be used. The second embodiment differs from the first embodiment in that a susceptance circuit B (see FIGS. 10A-10B) is added to the internal configuration of the HF_RF circuit 131 of the matching unit 130, and that the third control device 135 performs a third MD reduction process by impedance adjustment (see FIG. 13 and FIG. 15).

Figure 10A:
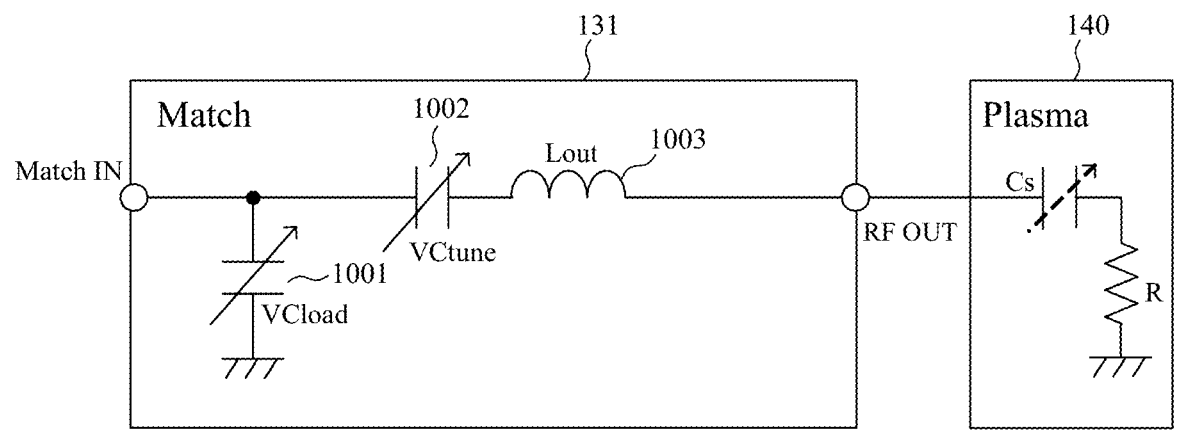
FIGS. 10A-10B illustrate an internal configuration example of an HF_RF circuit 131.
Figure 10B:
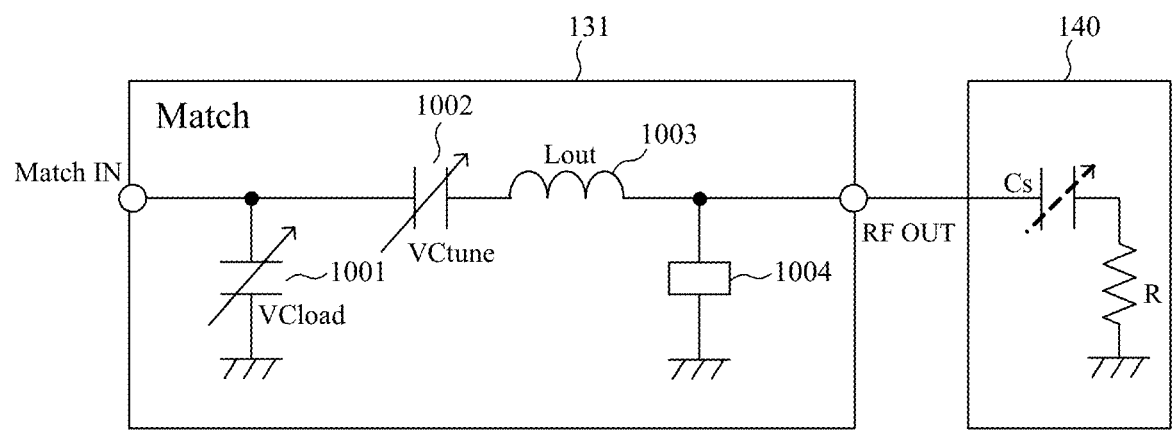

FIGS. 10A-10B illustrate an internal configuration example of the HF_RF circuit 131. FIG. 10A illustrates an internal configuration example of the HF_RF circuit 131 according to the first embodiment. FIG. 10B illustrates an internal configuration example of HF_RF circuit 131 according to the second embodiment.

As illustrated in FIG. 10A, the HF_RF circuit 131 according to the first embodiment is provided with a first variable capacitor 1001 and a second variable capacitor 1002 for impedance adjustment, and a coil 1003 for providing high-frequency power to the load 140. HF_RF circuit 131 is configured to perform impedance matching by varying the capacitance of the first variable capacitor 1001 and the second variable capacitor 1002, in response to an instruction from the third control device 135. On the other hand, the HF_RF circuit 131 according to the second embodiment, as illustrated in FIG. 10B, is provided with an impedance phase adjusting circuit 1004 on the power output side, in addition to the first variable capacitor 1001, the second variable capacitor 1002, and the coil 1003. As the impedance phase adjusting circuit 1004, a susceptance circuit may be used. The susceptance circuit may be composed of a coil L or a capacitor C, or both. By changing the susceptance B of the susceptance circuit, the impedance phase of the HF_RF circuit 131 of the matching unit 130 is changed. In this way, it is possible to align the change in impedance locus due to FM modulation (frequency change) in the source power supply 110 with the change in impedance locus due to IMD, and to thereby suppress the |γ|. It is noted that it is not necessary to change circuit constants (such as the capacitance variable capacitor C and the inductance variable coil L).

<Effect of Suppression of Absolute Value |γ| of Power Reflection Coefficient>

Figure 11A:
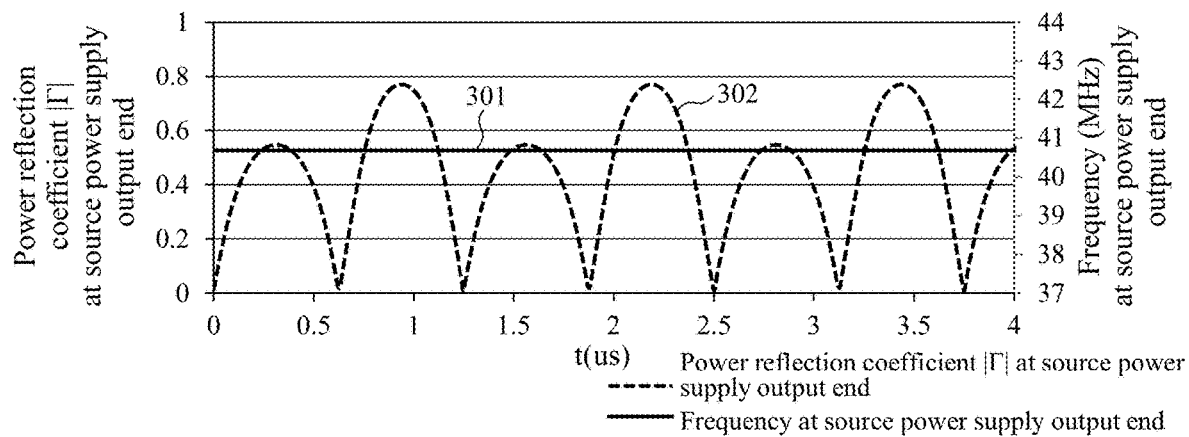
FIGS. 11A-11C illustrate technical effects that are obtained when a susceptance circuit is provided in a matching unit circuit 130.
Figure 11B:
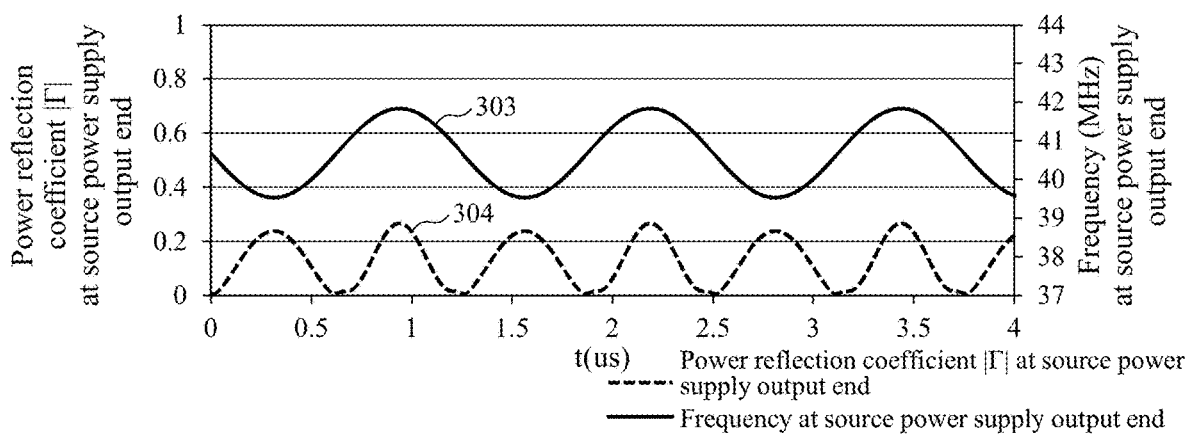
Figure 11C:
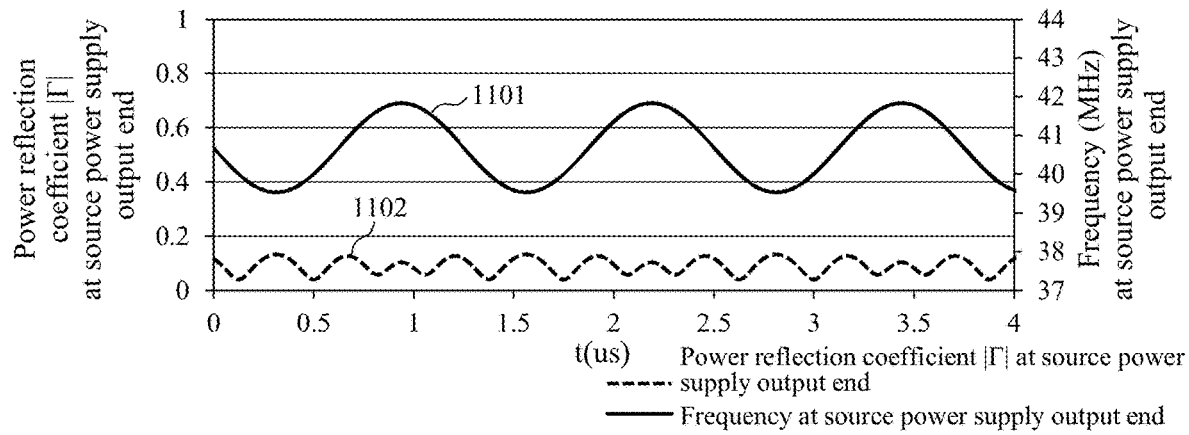

When a susceptance circuit was provided in the matching unit circuit 130 and simulations were performed, the results illustrated in FIG. 11 were obtained. Under the simulation conditions including a source power supply frequency of 40.68 MHz, a bias power supply frequency of 400 kHz, and a plasma impedance $Z=1-j\times5.6$, when the plasma sheath capacitance Cs was changed from 490 pF to 910 pF by the bias voltage at periods twice the bias frequency, the power reflection coefficient |γ| at the output end of the source power supply became as illustrated in FIG. 11C. FIG. 11A illustrates the variations in the absolute value |γ| of the power reflection coefficient when, similarly to FIG. 3A, the output of the source power supply was output as is (without even FM modulation). FIG. 11B illustrates the variations in the absolute value |γ| of the power reflection coefficient when, similarly to FIG. 3B, the output of the source power supply 110 was only FM modulated. FIG. 11C illustrates the variations in the absolute value |γ| of the power reflection coefficient when the output of the source power supply 110 was FM modulated and subjected to phase change by the susceptance circuit.

It is seen that, while the absolute value |γ| of the power reflection coefficient in FIG. 11B is suppressed compared to FIG. 11A, the absolute value of the power reflection coefficient in FIG. 11C is even more suppressed.

Figure 12:
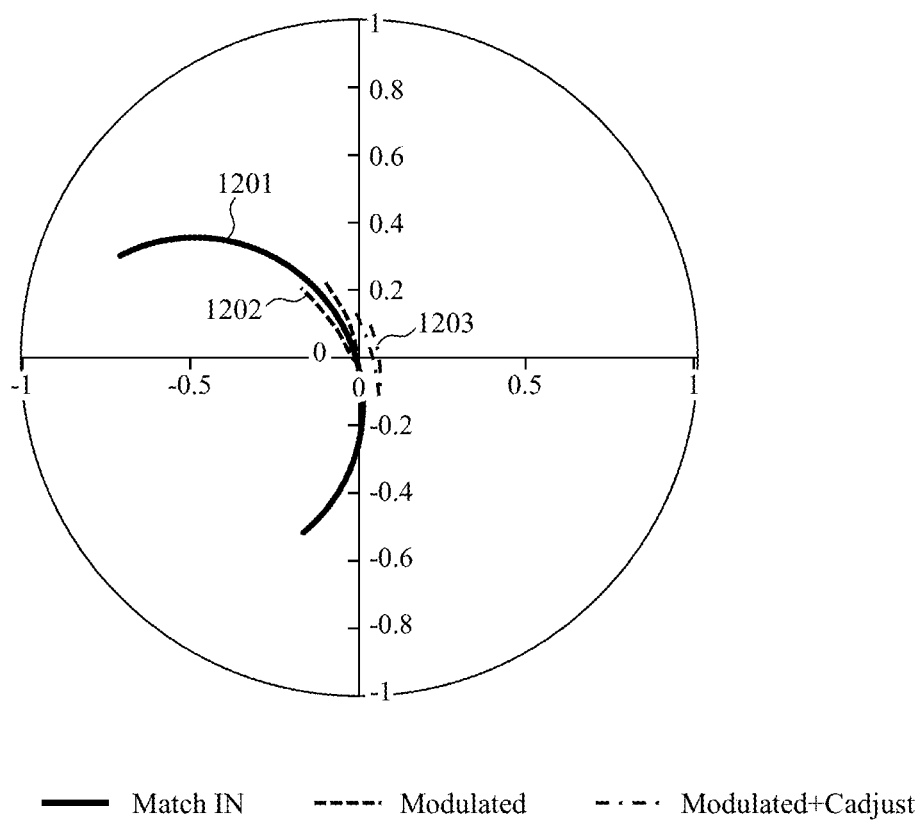
FIG. 12 is a Smith chart representation of the graphs of FIGS. 11A-11C.

FIG. 12 is a Smith chart representation of the graphs of FIGS. 11A-11C. It will be also understood from FIG. 12 that an effect of suppressing the absolute value |γ| of the power reflection coefficient is obtained. A change 1203 in impedance locus due to frequency variation of the output of the source power supply 110 and the insertion of the susceptance circuit is significantly improved in width (amplitude) and phase of the change over a change 1202 in impedance locus due to the frequency variation (alone) of the output of the source power supply 110, not to mention over the change 1201 in impedance locus due to IMD.

<Contents of IMD Reduction (Power Reflection Coefficient |γ| Suppression) Process>

Figure 13:
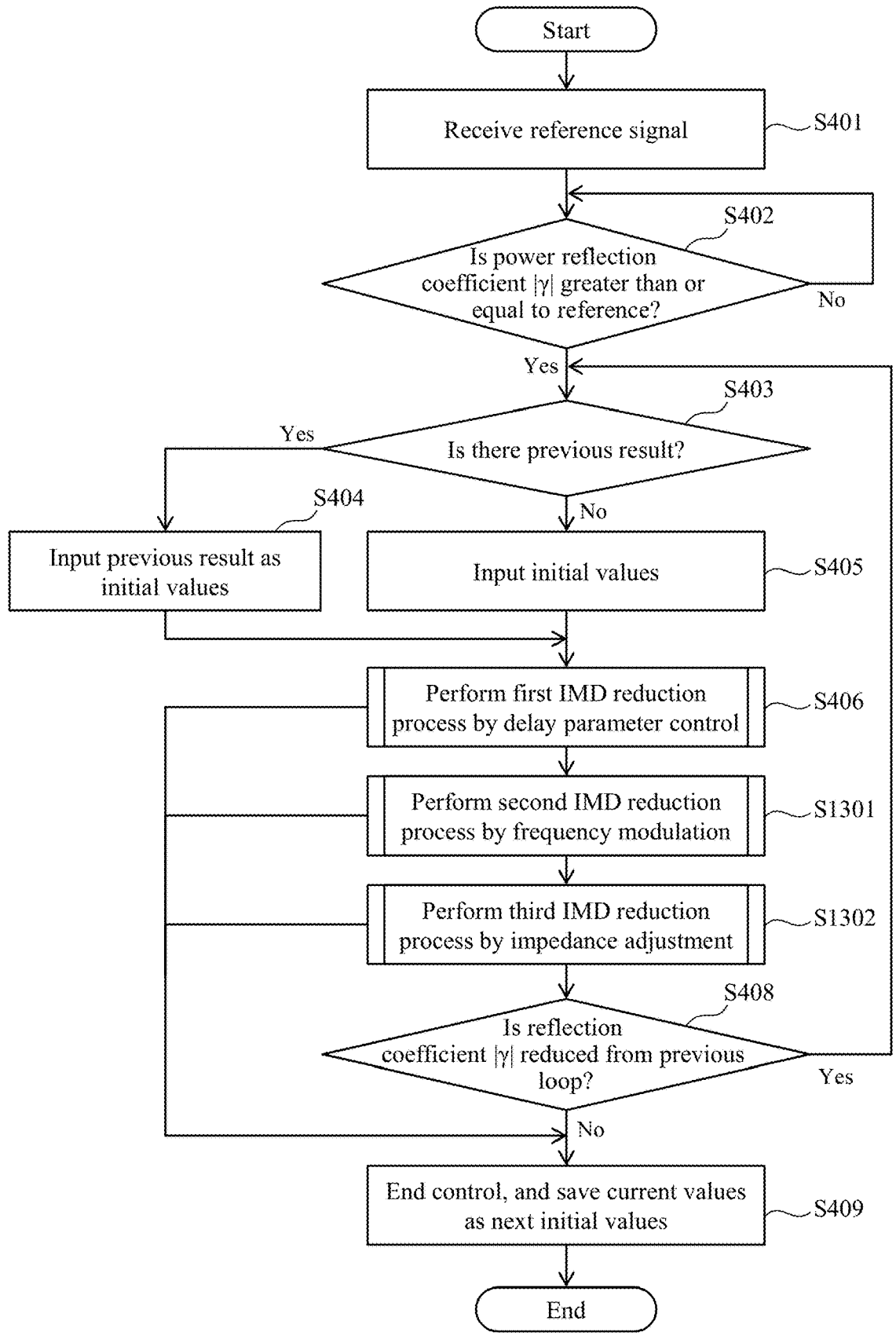
FIG. 13 is a flowchart for describing the outline of an IMD reduction (power reflection coefficient |γ| suppression) process according to the second embodiment.
Figure 14:
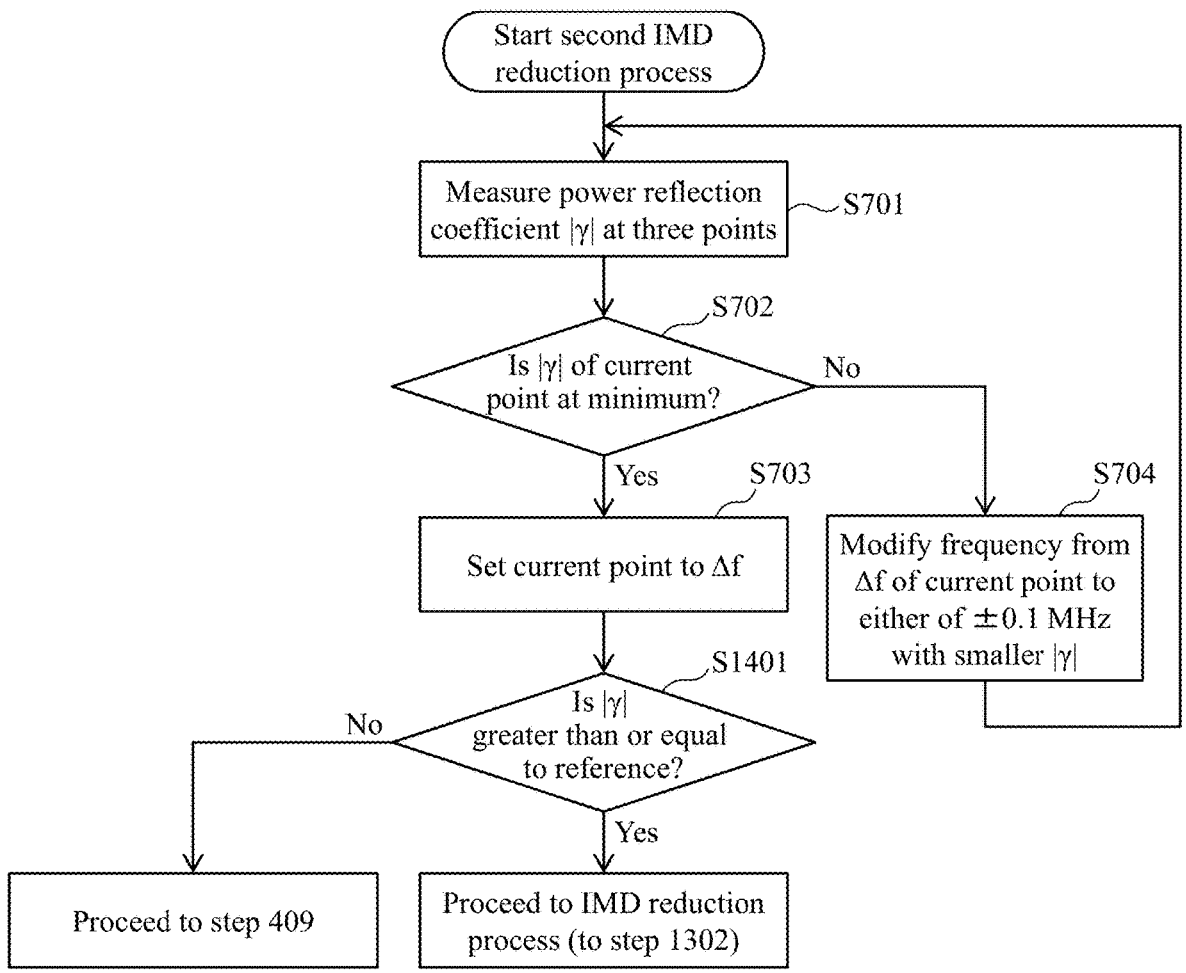
FIG. 14 is a flowchart for describing the details of step 1301 (a second IMD reduction process by frequency modulation) of FIG. 13.
Figure 15:
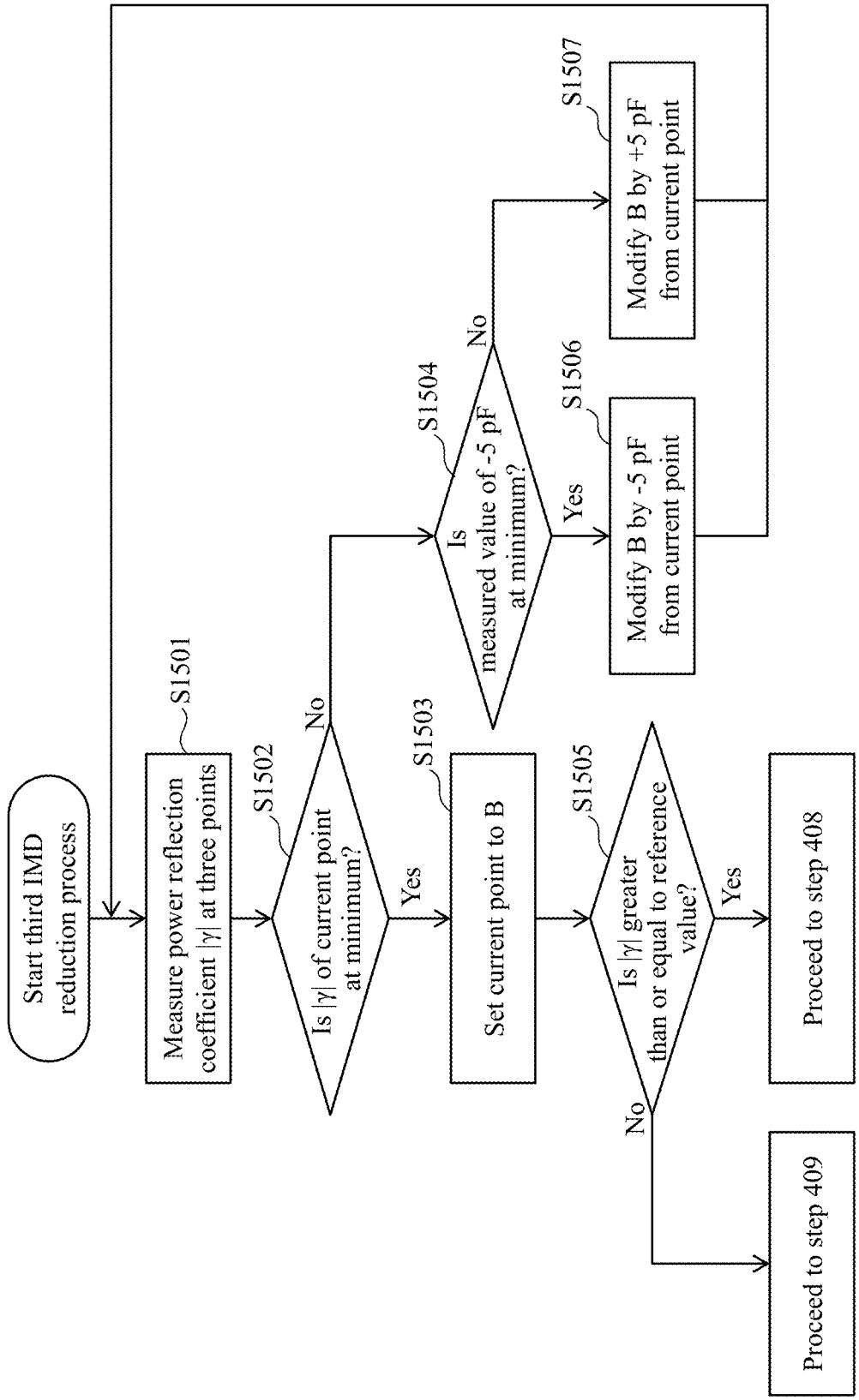
FIG. 15 is a flowchart for describing the details of step 1302 (a third IMD reduction process by impedance adjustment) of FIG. 13.

FIG. 13 is a flowchart for describing the outline of an IMD reduction (power reflection coefficient |γ| suppression) process according to the second embodiment. The first IMD reduction process by delay parameter control is similar to that of the first embodiment. FIG. 14 is a flowchart for describing the details of step 1301 (the second IMD reduction process by frequency modulation) of FIG. 13. FIG. 15 is a flowchart for describing the details of step 1302 (the third IMD reduction process by impedance adjustment) of FIG. 13. The third IMD reduction process (step 1303) may be configured to be performed by the third control device 135 of the matching circuit 130, and the other steps may be configured to be performed by the first control device 113 of the source power supply 110.

A. Outline of IMD Reduction (Power Reflection Coefficient |γ| Suppression) Process (FIG. 13)

(i) The Process from Step 401 to Step 406 is similar to the First Embodiment. Thus, Description of these Steps will be Omitted.

(ii) Step 1301

The first control device 113 of the source power supply 110, if the |γ| after the first IMD reduction process by delay parameter control has been performed is greater than or equal to a predetermined reference value, performs the second IMD reduction process by frequency modulation. If the |γ| became less than the predetermined reference value as a result of the second IMD reduction process, the process proceeds to step 409. On the other hand, if the |γ| remains greater than or equal to the predetermined reference value, the process proceeds to step 1302. When proceeding to step 1302, the first control device 113 notifies the third control device 135 of the matching circuit 130 of the result of the second IMD reduction process (that they |γ| did not become less than the reference value).

The details of the second IMD reduction process by frequency modulation are substantially the same as those of FIG. 7. However, the process differs from step 407 (FIG. 4) in that if the |γ| remained greater than or equal to the predetermined reference value, the process proceeds to step 1302. The details of step 1302 are illustrated in FIG. 14.

(iii) Step 302

The third control device 135 of the matching circuit 130, if the |γ| remained greater than or equal to the predetermined reference value after the second IMD reduction process by frequency modulation has been performed, performs the third IMD reduction process by impedance adjustment. If the |γ| became less than the predetermined reference value as a result of the third IMD reduction process, the process proceeds to step 409. On the other hand, if the |γ| remained greater than or equal to the predetermined reference value, the process proceeds to step 408. The details of step 1302 will be described later with reference to FIG. 15.

(iv) Step 408

The first control device 113 acquires from the third control device 135 of the matching unit 130 the absolute value |γ| of the power reflection coefficient, and determines whether the current value |γ| of the power reflection coefficient has decreased from the result (the value |γ| of the power reflection coefficient) obtained in the previous loop (previous IMD reduction process). If the current value |γ| of the power reflection coefficient is not decreased from the previous result (No in step 408), the process proceeds to step 409. If the current value |γ| of the power reflection coefficient is decreased from the previous result (Yes in step 408), the process proceeds to step 403. If the process returned to step 403, the "previous result" in step 403 corresponds to the parameter values on which the value |γ| of the power reflection coefficient greater than or equal to the reference value that was obtained in step 1302 is based.

(v) Step 409

The first control device 113 ends the IMD reduction process, and stores parameter values corresponding to the value |γ| of the power reflection coefficient obtained by the current process in memory as the initial values for the next process.

B. Contents of Second IMD Reduction Process by Frequency Modulation

FIG. 14 is a flowchart for describing the details of the second IMD reduction process by frequency modulation (step 1301) according to the second embodiment.

As illustrated in FIG. 14, the contents of the process are substantially the same as those of the flowchart of FIG. 7. However, the process differs from FIG. 7 in that in step 1401, if the |γ| after the second IMD reduction process by frequency modulation has been performed is greater than or equal to the predetermined reference value, the process proceeds not to step 408 (see step 705), but proceeds to the third IMD reduction process by impedance adjustment (step 1302). The other steps are the same as those of FIG. 7, and their description will be omitted.

C. Details of Third IMD Reduction Process by Impedance Adjustment

FIG. 15 is a flowchart for describing the details of the third IMD reduction process by impedance adjustment (step 1302) performed according to the second embodiment.

(i) Step 1501

The third control device 135 of the matching unit 130 measures the power reflection coefficient at three points. For example, the third control device 135 of the matching unit 130 calculates the absolute value |γ| of the power reflection coefficient at the current point (the variable capacitor capacitance at the current point in time in the impedance phase adjusting circuit 1004), and the absolute value |γ| of the power reflection coefficient when the variable capacitor capacitance of the impedance phase adjusting circuit 1004 is changed from the value at the current point in time by ±5 pF (which may be set, as appropriate, by the user).

Figure 16:
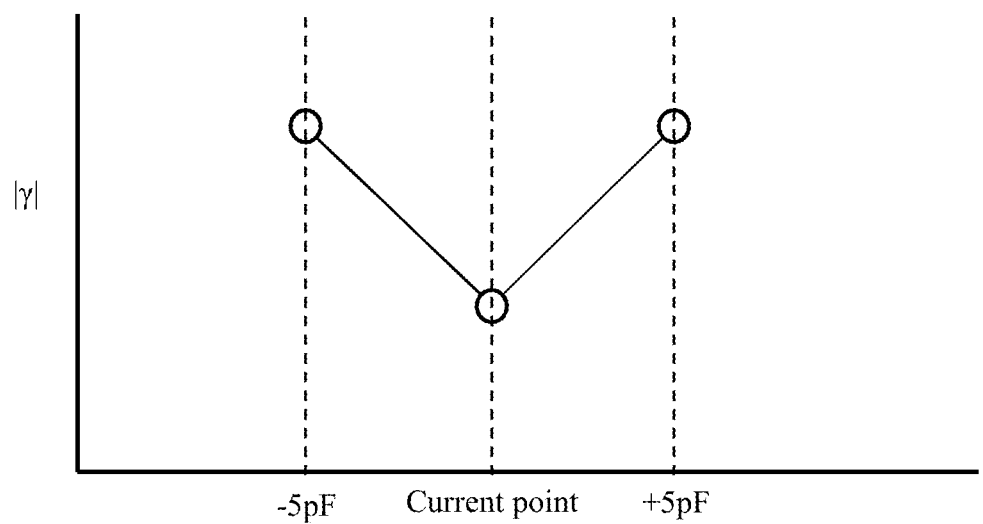
FIG. 16 illustrates the relationship (example) between the absolute value |γ| of the power reflection coefficient when at the susceptance value of the current point and the absolute value |γ| of the power reflection coefficient when the susceptance value is modified by ±5 pF from the current point.

FIG. 16 illustrates the relationship (example) between the absolute value |γ| of the power reflection coefficient when at the susceptance value of the current point and the absolute value |γ| of the power reflection coefficient when the susceptance value is modified from the current point by ±5 pF. FIG. 16 illustrates an example in which the absolute value |γ| of the power reflection coefficient at the current point is at a minimum.

While herein the absolute value |γ| of the power reflection coefficient is compared at three points, the reflected wave power values per se may be compared. When the impedance phase adjusting circuit 1004 is composed of a variable capacitor and a variable coil, the power reflection coefficient |γ| when the susceptance B is modified by ±predetermined amount (S) is calculated.

(ii) Step 1502

The third control device 135 determines whether the absolute value |γ| of the power reflection coefficient at the current point is at a minimum among the three points. If the absolute value |γ| of the power reflection coefficient at the current point is at a minimum (Yes in step 1502), the process proceeds to step 1503. If the absolute value |γ| of the power reflection coefficient at the current point is not at a minimum (No in step 1502), the process proceeds to step 1504.

(iii) Step 1503

The third control device 135 sets the susceptance value of the current point as the susceptance B of the impedance phase adjusting circuit 1004, and acquires the absolute value |γ| of the power reflection coefficient (wherein the value calculated in step 1501 may be acquired, or the value may be newly calculated).

(iv) Step 1504

The third control device 135 determines whether the absolute value |γ| of the power reflection coefficient when the susceptance value is modified from the current point by −5 pF is at a minimum among the three points. If the absolute value |γ| of the power reflection coefficient when the susceptance value is modified by −5 pF from the current point is at a minimum (Yes in step 1504), the process proceeds to step 1506. If the absolute value |γ| of the power reflection coefficient when the susceptance value is modified by +5 pF from the current point is at a minimum among the three points (No in step 1504), the process proceeds to step 1507.

(v) Step 1505

The third control device 135 determines whether the absolute value |γ| of the power reflection coefficient acquired in step 1503 is greater than or equal to the preset reference value. If the |γ| is greater than or equal to the reference value (Yes in step 1505), the process proceeds to step 408. If the |γ| is less than the reference value (No in step 1505), the process proceeds to step 409.

(vi) Step 1506

The third control device 135 sets the susceptance value obtained by modifying the susceptance value of the current point by +5 pF as the susceptance value of the current point for the next loop. In this way, the point at which the absolute value |γ| of the power reflection coefficient is at a minimum is identified by modifying the susceptance value of the current point.

(vii) Step 1507

The third control device 135 sets the susceptance value obtained by modifying the susceptance value of the current point by +5 pF as the susceptance value of the current point for the next loop. In this way, the point at which the absolute value |γ| of the power reflection coefficient is at a minimum is identified by modifying the susceptance value of the current point.

<Simulation Results>

Figure 17:
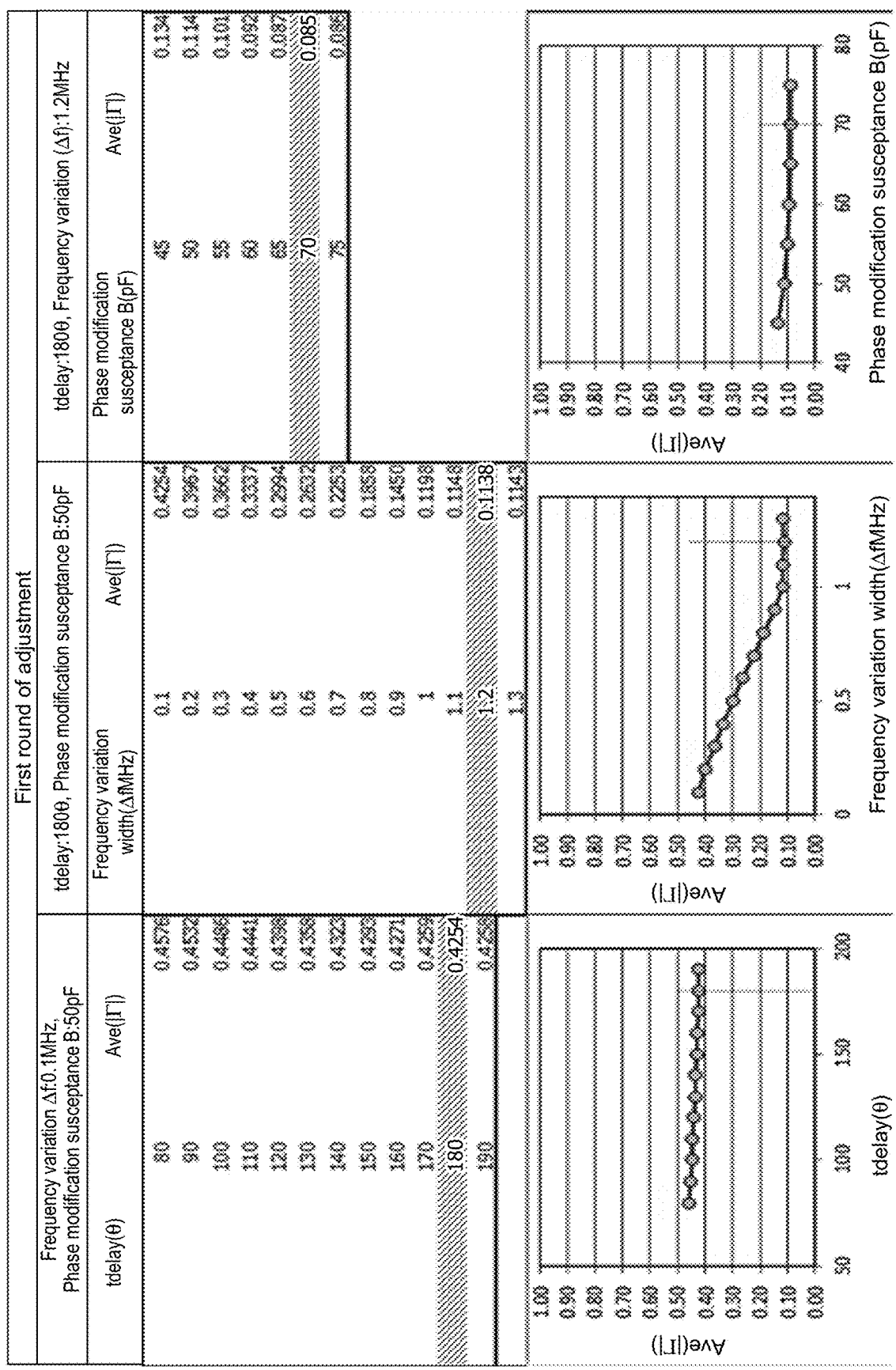
FIG. 17 shows a diagram (charts) illustrating the results of simulations of an IMD reduction (power reflection coefficient |γ| suppression) process according to the second embodiment.

FIG. 17 shows diagrams (charts) illustrating the results of simulations of the IMD reduction (power reflection coefficient |γ| suppression) process according to the second embodiment. During the simulations, the initial values included a delay parameter tdelay=90 degrees, a frequency variation width ΔF=0.1 MHz, and a susceptance B=50 pF. Initially, only the delay parameter tdelay for FM modulation is varied in increments of 10 degrees to determine a tdelay exhibiting the minimum absolute value |γ| of the power reflection coefficient, and, with the tdelay fixed, the frequency 0.1 MHz is varied to determine a ΔF exhibiting the minimum absolute value |γ| of the power reflection coefficient. Further, with the tdelay and ΔF exhibiting the minimum absolute value |γ| of the power reflection coefficient fixed, the susceptance B is varied in 5 pF increments to determine a susceptance B exhibiting the minimum absolute value |γ| of the power reflection coefficient.

As illustrated in FIG. 17, when the delay parameter tdelay is varied in increments of 10 degrees, the absolute value |γ| of the power reflection coefficient (average value) was minimized at 0.4254 when tdelay=180 degrees. Then, with tdelay fixed at 180 degrees, when the modulation frequency was varied in 0.1 MHz increments, the absolute value |γ| of the power reflection coefficient (average value) was minimized at 0.1138 when ΔF=1.2 MHz. Further, with tdelay fixed at 180 degrees and ΔF at 1.2 MHz, when the susceptance B was varied from 50 pF in 5 pF increments, the absolute value |γ| of the power reflection coefficient (average value) was minimized at 0.085 when B=70 pF. Thus, by varying the delay parameter, the frequency variation width, and the susceptance B, it was possible to reduce the absolute value |γ| of the power reflection coefficient 302 due to IMD illustrated in FIG. 11A to the absolute value |γ| 1102 of the power reflection coefficient illustrated in FIG. 11C.

(3) Conclusion (i) According to the present embodiment, in the high-frequency power supply system (power supply system), the source power supply: determines the delay setting value (tdelay) indicating the timing of starting the frequency variation process with respect to the source power; performs the frequency variation process (FM modulation process) using the delay setting value and the value of the operation frequency of the bias power supply (first frequency); and outputs a frequency-varied source power to the matching unit. Thus, during FM modulation, initially the tdelay is varied (with the frequency modulation frequency (degree of modulation) fixed to art initial value), whereby the effect of FM modulation can be maximized. According to the present embodiment, the determination of the delay setting value (tdelay) is performed prior to the frequency variation process (FM modulation process). This is because, while it would be ideal if the reflected wave power can be reduced by varying frequency in response to variations in plasma impedance (variations in plasma sheath capacity), the frequency variation width would become greater and the reflected wave power would increase if the movement of the varied frequency is opposite to the movement of plasma impedance. Accordingly, with the frequency fixed at the initial value, the delay time setting process is initially performed to determine an optimum delay time setting value, and then the FM modulation process is performed again to discover an optimum value. First, it is important to align the direction of plasma impedance variations with the direction of frequency variations due to the delay time setting (+low frequency variation). In other words, the delay time setting is performed first in order to align the timing as to whether the frequency is started to vary front the +side or the −side, and when.

Further, in the present embodiment, when, as a result of the frequency variation process based on the delay setting value (variation in tdelay), an indicator value (for example, the power reflection coefficient) associated with the reflected wave power from the load is greater than a predetermined reference value, the source power supply performs the frequency variation process by modifying the frequency variation width (Δf). In this way, it becomes possible to reduce the reflected wave power or power reflection coefficient due to IMD.

(ii) Further, in the present embodiment, the impedance matching circuit of the matching unit may be provided with an impedance phase adjusting element. When, as a result of the frequency variation process performed by modifying the frequency variation width (Δf), the indicator value (power reflection coefficient) associated with the reflected wave power from the load is greater than a predetermined reference value, the matching unit causes the phase of the matching unit to be changed by the impedance phase adjusting element. In this way, it becomes possible to align the direction of impedance change due to FM modulation with the direction of impedance change due to IMD, making it possible to greatly improve the IMD reduction effect due to FM modulation.

(iii) As the IMD reduction procedure in the present embodiment, first, the source power supply performs the frequency variation process while varying the delay setting value (tdelay) in increments of a predetermined width (for example, ±10 degrees; in the case of bias frequency 800 kHz, a 0.035 μs delay time), and acquires an optimum delay setting value such that the indicator value obtained by varying the delay setting value is minimized. The source power supply fixes the delay setting value to the optimum delay setting value, performs the frequency variation process while varying the frequency variation width (Δf) in increments of a predetermined width (for example, +0.1 MHz), and acquires an optimum frequency variation width such that the indicator value obtained by varying the frequency variation width is minimized. Further, the source power supply, with the delay setting value and the frequency setting value fixed to the optimum delay setting value and the optimum frequency variation width, respectively, performs the frequency variation process. Further, the matching unit, by causing the phase of the matching unit to be changed in increments of a predetermined width (for example, ±5 pF) by the impedance phase adjusting element, calculates a minimum indicator value. Through the above procedure, the frequency modulation process is performed and a high-frequency power is supplied to the load, whereby it becomes possible to reduce IMD efficiently and sufficiently.

(iv) The functions of the present embodiment may also be implemented by software program code. In this case, a storage medium with the program code recorded thereon may be provided to a system or device, and a computer (or CPU or MPU) of the system or device may read the program code stored on the storage medium. In this case, the program code per se that has been read from the storage medium will provide the functions of the embodiments described above, and the program code per se and the storage medium having the same stored thereon will constitute the present disclosure, Exemplary storage media for supplying such program code include a flexible disc, a CD-ROM, a DVD-ROM, a hard disk, an optical disk, a magneto-optical disk, a CD-R, magnetic tape, a nonvolatile memory card, and a ROM.

Also, an operating system (OS) or the like running on a computer may perform some or all of actual processes based on an instruction of the program code, and the functions of the embodiments described above may be implemented by the processes. Further, after the program code read from the storage medium has been written to a memory on a computer, a CPU or the like of the computer may perform some or all of actual processes based on an instruction of the program code, and the functions of the embodiments described above may be implemented by the processes.

Further, software program code for implementing the functions of an embodiment may be delivered via a network and stored in a storage means, such as a hard disk or a memory of a system or device, or stored in a storage medium such as a CD-RW or a CD-R. In use, the program code may be read from the storage means or the storage medium and performed by a computer (or CPU or MPU) of the system or device.

The processes and techniques described herein are not in essence associated with any specific device. Various general-purpose devices may be used in accordance with the descriptions of the present disclosure. In some cases, it may be beneficial to construct a dedicated device for performing the techniques of the present disclosure.

Various embodiments may be formed by combining a plurality of constituent elements disclosed herein. For example, some of the constituent elements disclosed in the embodiments may be eliminated. Further, constituent elements from different embodiments may be combined, as appropriate. While the techniques of the present disclosure have been described with reference to concrete embodiments, these are not intended as limiting the techniques of the present disclosure and are instead for illustrative purposes. It will be apparent to those skilled in the art that hardware, software, and firmware may be combined in a number of appropriate ways to implement the techniques of the present disclosure. For example, software described may be implemented using a wide variety of programs or script languages, such as assembler, C/C++, perl, Shell, PHP, Java (registered trademark), and the like.

Control lines and information lines that are illustrated with respect to the foregoing embodiments are those considered necessary for convenience of description, and do not necessarily represent all of control lines and information lines that are required in a product. All of the configurations may be interconnected.

DESCRIPTION OF SYMBOLS 100, 200 High-frequency power supply system (power supply system)
110 Source (HF) power supply
111 RF amplifier
112 First sensor
113 First control device
120 Bias (LF) power supply
121 RF amplifier
122 Second sensor
123 Second control device
130 Matching unit
131 HF_RF circuit
132 Third sensor
133 LF_RF circuit
134 Fourth sensor
135 Third control device
140 Load (plasma load)

What is claimed is:

1. A high-frequency power supply system for providing high-frequency power to a connected load, the system comprising:
a bias power supply which outputs a bias power at a first frequency;
a source power supply which outputs a source power at a second frequency higher than the first frequency; and
a matching unit including an impedance matching circuit which acquires the bias power and the source power, and matches an impedance of the source power supply side with an impedance of the load side,
wherein:
the matching unit superimposes the source power with the bias power and supplies the load with a superimposed power; and
the source power supply acquires information about the first frequency, determines a delay setting value indicating a timing of starting a frequency variation process with respect to the source power, performs the frequency variation process using the delay setting value and a value of the first frequency, and outputs a frequency-varied source power to the matching unit.

2. The high-frequency power supply system according to claim 1, wherein, if, as a result of the frequency variation process based on the delay setting value, an indicator value associated with a reflected wave power from the load is greater than a predetermined reference value, the source power supply modifies a frequency variation width and performs the frequency variation process.

3. The high-frequency power supply system according to claim 2, wherein:
the matching unit includes an impedance phase adjusting element in the impedance matching circuit; and
if, as a result of the frequency variation process performed with the modified frequency variation width, the indicator value associated with the reflected wave power from the load is greater than the predetermined reference value, the matching unit causes a phase of the matching unit to be changed by the impedance phase adjusting element.

4. The high-frequency power supply system according to claim 1, wherein the source power supply performs the frequency variation process while varying the delay setting value in increments of a predetermined width, and acquires an optimum delay setting value such that an indicator value obtained by varying the delay setting value is minimized.

5. The high-frequency power supply system according to claim 2, wherein the source power supply performs the frequency variation process while varying the delay setting value in increments of a predetermined width, and acquires an optimum delay setting value such that an indicator value obtained by varying the delay setting value is minimized.

6. The high-frequency power supply system according to claim 3, wherein the source power supply performs the frequency variation process while varying the delay setting value in increments of a predetermined width, and acquires an optimum delay setting value such that an indicator value obtained by varying the delay setting value is minimized.

7. The high-frequency power supply system according to claim 4, wherein the source power supply fixes the delay setting value at the optimum delay setting value, performs the frequency variation process while varying the frequency variation width in increments of the predetermined width, and acquires an optimum frequency variation width such that the indicator value obtained by varying the frequency variation width is minimized.

8. The high-frequency power supply system according to claim 5, wherein the source power supply fixes the delay setting value at the optimum delay setting value, performs the frequency variation process while varying the frequency variation width in increments of the predetermined width, and acquires an optimum frequency variation width such that the indicator value obtained by varying the frequency variation width is minimized.

9. The high-frequency power supply system according to claim 6, wherein the source power supply fixes the delay setting value at the optimum delay setting value, performs the frequency variation process while varying the frequency variation width in increments of the predetermined width, and acquires an optimum frequency variation width such that the indicator value obtained by varying the frequency variation width is minimized.

10. The high-frequency power supply system according to claim 7, wherein:
the source power supply performs the frequency variation process with the delay setting value and the frequency setting value fixed to the optimum delay setting value and the optimum frequency variation width, respectively; and the matching unit further calculates the minimized indicator value by causing a phase of the matching unit to be changed by an impedance phase adjusting element in increments of the predetermined width.

11. The high-frequency power supply system according to claim 8, wherein:
- the source power supply performs the frequency variation process with the delay setting value and the frequency setting value fixed to the optimum delay setting value and the optimum frequency variation width, respectively; and
- the matching unit further calculates the minimized indicator value by causing a phase of the matching unit to be changed by an impedance phase adjusting element in increments of the predetermined width.

12. The high-frequency power supply system according to claim 9, wherein:
- the source power supply performs the frequency variation process with the delay setting value and the frequency setting value fixed to the optimum delay setting value and the optimum frequency variation width, respectively; and
- the matching unit further calculates the minimized indicator value by causing a phase of the matching unit to be changed by an impedance phase adjusting element in increments of the predetermined width.

* * * * *

UNITED STATES PATENT AND TRADEMARK OFFICE
CERTIFICATE OF CORRECTION

PATENT NO. : 11,309,164 B2
APPLICATION NO. : 17/092878
DATED : April 19, 2022
INVENTOR(S) : Michio Taniguchi et al.

It is certified that error appears in the above-identified patent and that said Letters Patent is hereby corrected as shown below:

In the Specification

Please replace "THP" with – THE – (Column 2, Line 35);

Please replace "coefficient after" with – coefficient |y| after – (Column 2, Line 50);

Please replace "ERR" with – FHF: – (Column 5, Line 34);

Please replace "ELF" with – FLF – (Column 5, Line 35);

Please replace "IA)" with – IMD – (Column 9, Line 50);

Please replace "varied h" with – varied by – (Column 12, Line 30);

Please replace "coeffident may" with – coefficient |y| may – (Column 12, Line 31);

Please replace "MD" with – IMD – (Column 12, Line 35);

Please replace "MD" with – IMD – (Column 12, Line 63);

Please replace "value of" with – value |y| of – (Column 13, Line 55);

Please replace "Step 302" with – Step 1302 – (Column 14, Line 43);

Please replace "art initial value" with – an initial value – (Column 17, Line 26); and Please replace "vary front" with – vary from – (Column 17, Line 46).

Signed and Sealed this
Eighteenth Day of October, 2022

Katherine Kelly Vidal
*Director of the United States Patent and Trademark Office*